US012796117B2

(12) United States Patent
Kawamura

(10) Patent No.: US 12,796,117 B2
(45) Date of Patent: Nov. 10, 2026

(54) SOLID-STATE IMAGING DEVICE AND METHOD FOR MANUFACTURING THE SAME, AND ELECTRONIC APPARATUS

(71) Applicant: SONY SEMICONDUCTOR SOLUTIONS CORPORATION, Kanagawa (JP)

(72) Inventor: Tomohiko Kawamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 615 days.

(21) Appl. No.: 18/249,362

(22) PCT Filed: Sep. 8, 2021

(86) PCT No.: PCT/JP2021/033046
§ 371 (c)(1),
(2) Date: Apr. 17, 2023

(87) PCT Pub. No.: WO2022/091592
PCT Pub. Date: May 5, 2022

(65) Prior Publication Data

US 2023/0395642 A1 Dec. 7, 2023

(30) Foreign Application Priority Data

Oct. 29, 2020 (JP) ................................ 2020-181870

(51) Int. Cl.
*H10F 39/18* (2025.01)
*H10F 39/00* (2025.01)

(52) U.S. Cl.
CPC ........... *H10F 39/18* (2025.01); *H10F 39/014* (2025.01); *H10F 39/8037* (2025.01); *H10F 39/807* (2025.01); *H10F 39/811* (2025.01)

(58) Field of Classification Search
CPC .... H10F 39/18; H10F 39/014; H10F 39/8037; H10F 39/807; H10F 39/811
See application file for complete search history.

(56) References Cited

U.S. PATENT DOCUMENTS 7,405,437 B2 7/2008 Shim
8,445,944 B2 5/2013 Ezaki
(Continued)

FOREIGN PATENT DOCUMENTS

CN 102738184 A 10/2012
JP 2006-120804 5/2006
(Continued)

OTHER PUBLICATIONS

International Search Report and Written Opinion prepared by the Japan Patent Office on Nov. 12, 2021, for International Application No. PCT/JP2021/033046, 2 pgs.

*Primary Examiner* — Eugene Lee
(74) *Attorney, Agent, or Firm* — SHERIDAN ROSS P.C.

(57) ABSTRACT

A transfer speed (pixel driving speed) at which a signal charge photoelectrically converted by a photoelectric conversion unit is transferred to a charge accumulation region is improved. A solid-state imaging device includes: a semiconductor layer having an active region defined by an isolation region on a first surface side; a charge accumulation region in the active region; a photoelectric conversion unit in the semiconductor layer and separated from the charge accumulation region in a depth direction; and a transfer transistor with a gate electrode in an isolation region that transfers a signal charge from the photoelectric conversion unit to the charge accumulation region. The isolation region includes an isolation insulating film on the first surface side of the semiconductor layer, and the gate electrode includes a first portion adjacent to the active region
(Continued)

with a gate insulating film interposed therebetween and a second portion adjacent to the isolation insulating film.

10 Claims, 22 Drawing Sheets

(56) References Cited

U.S. PATENT DOCUMENTS

| | | | | |
|---|---|---|---|---|
| 8,637,910 | B2 | 1/2014 | Koo | |
| 9,054,003 | B2 * | 6/2015 | Ahn | H10F 39/807 |
| 9,281,331 | B2 | 3/2016 | Chen | |
| 9,865,635 | B2 * | 1/2018 | Park | H10F 39/80373 |
| 2005/0167704 | A1 | 8/2005 | Ezaki | |
| 2006/0145215 | A1 * | 7/2006 | Paik | H10F 39/014 257/293 |
| 2008/0029796 | A1 | 2/2008 | Mori | |
| 2009/0303371 | A1 * | 12/2009 | Watanabe | H10F 39/802 257/292 |
| 2010/0108864 | A1 | 5/2010 | Ohta | |
| 2010/0117126 | A1 | 5/2010 | Takahashi | |
| 2011/0079832 | A1 | 4/2011 | Masagaki et al. | |
| 2011/0102620 | A1 | 5/2011 | Sakano et al. | |
| 2011/0181749 | A1 | 7/2011 | Yamada | |
| 2011/0187911 | A1 * | 8/2011 | Shinohara | H10F 39/151 257/E27.15 |
| 2012/0043589 | A1 | 2/2012 | Nozaki | |
| 2013/0221410 | A1 | 8/2013 | Ahn | |
| 2014/0246707 | A1 * | 9/2014 | Koo | H10F 39/80373 257/230 |
| 2014/0252420 | A1 | 9/2014 | Yi | |
| 2015/0243693 | A1 * | 8/2015 | Oh | H10F 39/80373 257/292 |
| 2016/0056198 | A1 * | 2/2016 | Lee | H10F 39/807 257/225 |
| 2016/0086984 | A1 | 3/2016 | Wang | |
| 2016/0155774 | A1 | 6/2016 | Hasegawa et al. | |
| 2016/0343752 | A1 * | 11/2016 | Tsai | H10F 39/812 |
| 2017/0077155 | A1 * | 3/2017 | Sano | H10F 39/80373 |
| 2017/0200759 | A1 * | 7/2017 | Ihara | H10F 39/807 |
| 2018/0190692 | A1 * | 7/2018 | Choi | H10F 39/8063 |
| 2018/0190694 | A1 * | 7/2018 | Ihara | H10F 39/802 |
| 2019/0057990 | A1 * | 2/2019 | Tanaka | H10F 39/8033 |
| 2019/0057991 | A1 * | 2/2019 | Hung | H10F 39/014 |
| 2020/0266223 | A1 | 8/2020 | Takahashi | |
| 2021/0143191 | A1 * | 5/2021 | Ha | H10F 39/199 |
| 2021/0203873 | A1 | 7/2021 | Machida | |
| 2022/0302191 | A1 * | 9/2022 | Jin | H10F 39/182 |

FOREIGN PATENT DOCUMENTS

| | | | |
|---|---|---|---|
| JP | 2011-082330 | | 4/2011 |
| JP | 2011-108839 | | 6/2011 |
| JP | 2016-103541 | | 6/2016 |
| JP | 2018-148116 | | 9/2018 |
| JP | 2020035916 | A | 3/2020 |
| KR | 100630704 | B1 | 10/2006 |
| KR | 20120030511 | A | 3/2012 |
| KR | 20160017623 | A | 2/2016 |
| WO | WO 2020/045142 | | 3/2020 |

* cited by examiner

SOLID-STATE IMAGING DEVICE AND METHOD FOR MANUFACTURING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2021/033046, having an international filing date of 8 Sep. 2021, which designated the United States, which PCT application claimed the benefit of Japanese Patent Application No. 2020-181870, filed 29 Oct. 2020, the entire disclosures of each of which are incorporated herein by reference.

TECHNICAL FIELD

The present technology (technology according to the present disclosure) relates to a solid-state imaging device and an electronic apparatus, and particularly relates to a technology effective for application to a solid-state imaging device including a transfer transistor and a method for manufacturing the same, and an electronic apparatus.

BACKGROUND ART

A solid-state imaging device includes, for each pixel, a transfer transistor that transfers a signal charge photoelectrically converted by a photoelectric conversion unit to a charge accumulation region. Patent Document 1 discloses a transfer transistor having a vertical structure in which a part (trunk) of a gate electrode is embedded in a trench of a substrate with a gate insulating film interposed therebetween. Furthermore, Patent Document 2 discloses an imaging device in which a groove for shallow trench isolation (STI) is formed in a substrate, a voltage is applied to an embedded polysilicon electrode embedded in the groove with an insulating film interposed therebetween to enhance pinning of an STI side wall at the time of accumulation, and a voltage is applied to a pixel region P-well and the embedded polysilicon electrode at the time of transfer to improve the transfer of a signal charge.

CITATION LIST

Patent Document

Patent Document 1: Japanese Patent Application Laid-Open No. 2018-148116

Patent Document 2: Japanese Patent Application Laid-Open No. 2006-120804

SUMMARY OF THE INVENTION

Problems to be Solved by the Invention

Meanwhile, in the conventional transfer transistor having the vertical structure, a part (embedded part) of the gate electrode is embedded in a semiconductor layer with the gate insulating film interposed therebetween, the periphery of the embedded part of the gate electrode, that is, all side walls in four directions are adjacent to (face) the semiconductor layer with the gate insulating film interposed therebetween. Therefore, in the embedded part of the gate electrode, a capacitance component (parasitic capacitance) with the semiconductor layer is added to all the side walls in the four directions. When the capacitance component is large, the capacitance of a transfer line connected to the gate electrode of the transfer transistor increases, and a drive pulse applied to the gate electrode of the transfer transistor is rounded, and thus, a transfer speed (pixel driving speed) at which a signal charge photoelectrically converted by a photoelectric conversion unit is transferred to a charge accumulation region decreases. Then, the decrease in the transfer speed affects processing performance of a solid-state imaging device, and thus, there is room for improvement.

An object of the present technology is to improve a transfer speed (pixel driving speed) at which a signal charge photoelectrically converted by a photoelectric conversion unit is transferred to a charge accumulation region.

Solutions to Problems

A solid-state imaging device according to an aspect of the present technology includes: a semiconductor layer having a first surface and a second surface located on mutually opposite sides, and having an active region defined by an isolation region on the first surface side; a charge accumulation region provided in the active region; a photoelectric conversion unit provided in the semiconductor layer to be separated from the charge accumulation region in a depth direction; and a transfer transistor that has a gate electrode provided in an isolation region and transfers a signal charge photoelectrically converted by the photoelectric conversion unit to the charge accumulation region. Then, the isolation region includes an isolation insulating film provided in a trench on the first surface side of the semiconductor layer, and the gate electrode includes a first portion adjacent to the active region with a gate insulating film interposed therebetween and a second portion adjacent to the isolation insulating film.

A method for manufacturing a solid-state imaging device according to another aspect of the present technology includes: forming an isolation trench that defines an active region on a first surface side of a semiconductor layer; forming an isolation insulating film in the isolation trench; etching the isolation insulating film in a depth direction of the isolation trench to form a gate trench surrounded by the semiconductor layer and the isolation insulating film in the isolation insulating film; forming a gate insulating film on the semiconductor layer in the gate trench; and forming a gate electrode in the gate trench with the gate insulating film interposed therebetween.

An electronic apparatus according to another aspect of the present technology includes the solid-state imaging device described above.

MODE FOR CARRYING OUT THE INVENTION

Hereinafter, embodiments of the present technology will be described in detail with reference to the drawings.

Note that, in all the drawings for describing the embodiments of the present technology, those having the same functions will be denoted by the same reference signs, and the repeated description thereof will be omitted.

Furthermore, each drawing is schematic and is sometimes different from an actual one. Furthermore, the following embodiments illustrate a device and a method for embodying the technical idea of the present technology, and do not specify configurations as follows. That is, various modifications can be added to the technical idea of the present technology within the technical scope described in the claims.

Furthermore, out of three directions orthogonal to each other in a space in the following embodiments, a first direction and a second direction orthogonal to each other in the same plane are assumed as an X direction and a Y direction, respectively, and a third direction orthogonal to the first direction and the second direction is assumed as a Z direction. In the following embodiments, a thickness direction of a semiconductor layer 20 as described later will be described as the Z direction.

First Embodiment

In a first embodiment, an example in which the present technology is applied to a solid-state imaging device that is a complementary metal oxide semiconductor (CMOS) image sensor of a back-surface irradiation type will be described.

<<Overall Configuration of Solid-State Imaging Device>>

First, an overall configuration of a solid-state imaging device 1A will be described.

Figure 1:
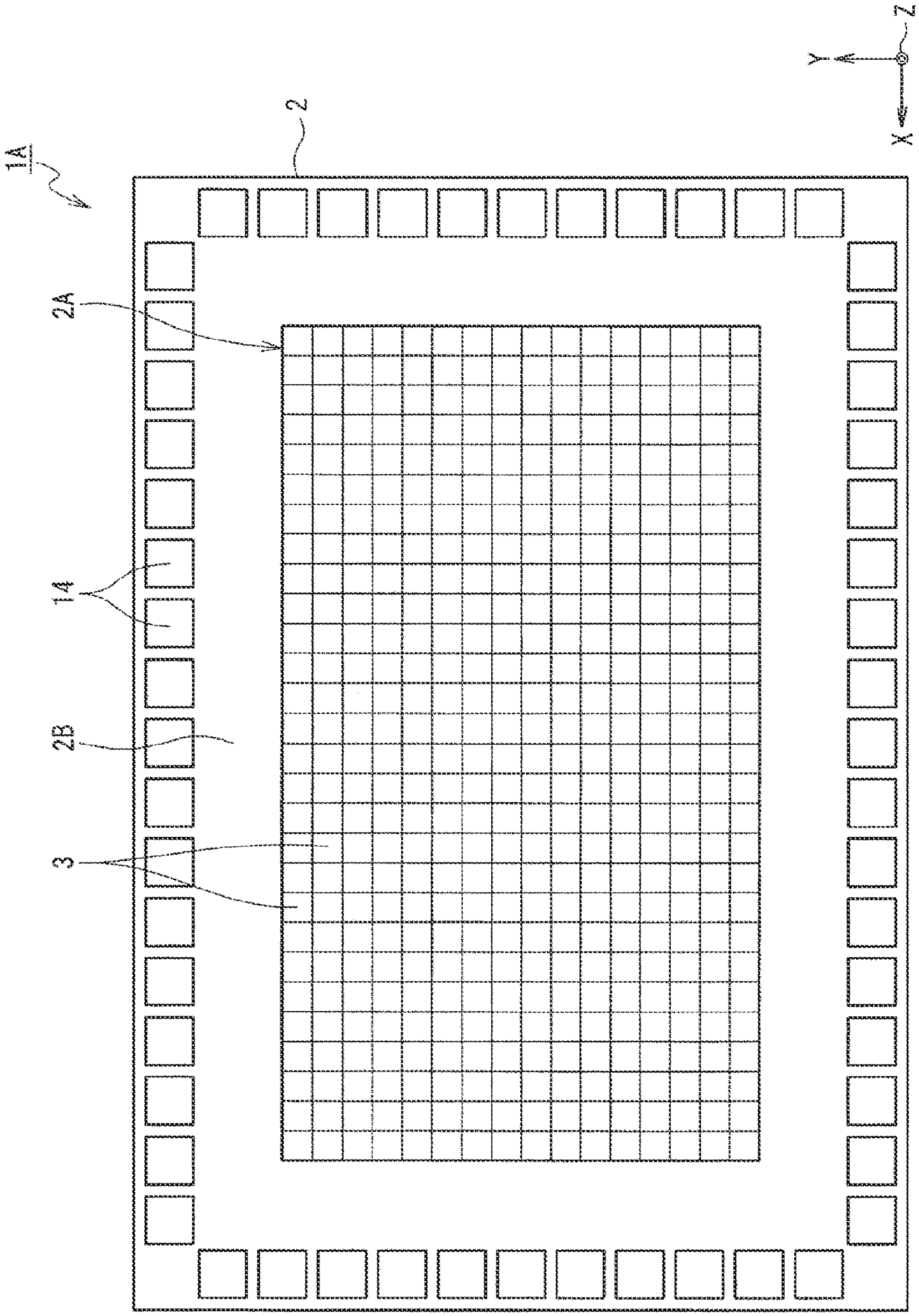
FIG. 1 is a plan layout diagram schematically illustrating a configuration example of a solid-state imaging device according to a first embodiment of the present technology.
Figure 12:
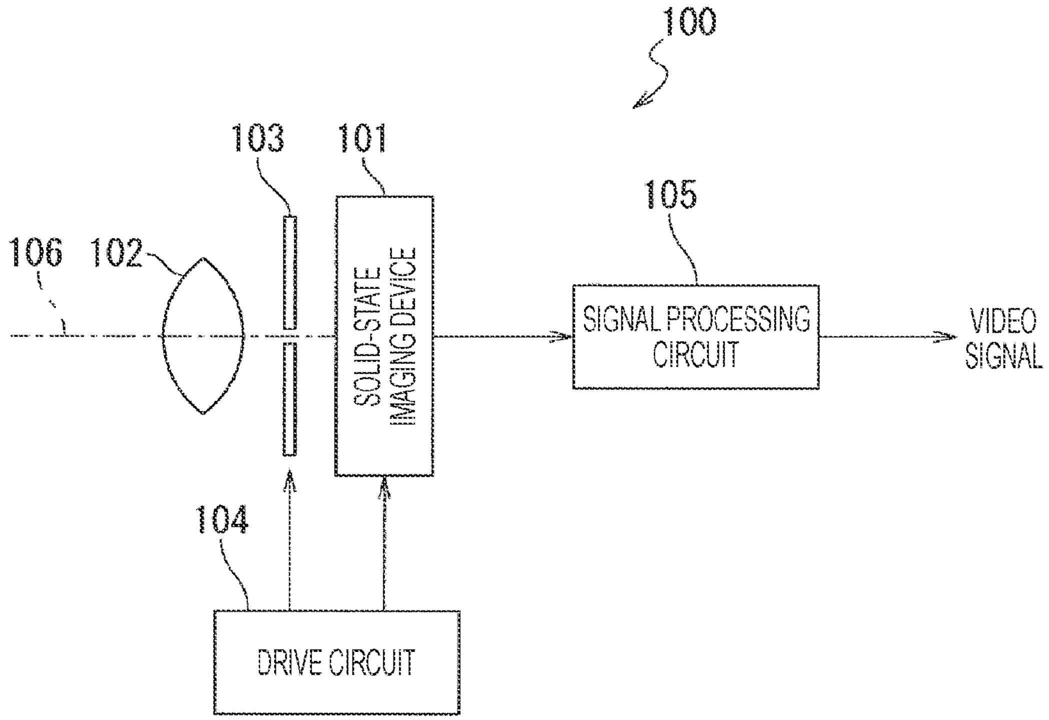
FIG. 12 is a schematic configuration diagram of an electronic apparatus according to a fourth embodiment of the present technology.

As illustrated in FIG. 1, the solid-state imaging device 1A according to the first embodiment of the present technology mainly includes a semiconductor chip 2 whose two-dimensional planar shape is rectangular when viewed in a plan view. That is, the solid-state imaging device 1A is mounted on the semiconductor chip 2. As illustrated in FIG. 12, the solid-state imaging device 1A (101) takes image light (incident light 106) from a subject via an optical lens 102, converts a light amount of the incident light 106 formed on an imaging surface into an electrical signal in units of pixels, and outputs the electrical signal as a pixel signal.

As illustrated in FIG. 1, the semiconductor chip 2 on which the solid-state imaging device 1A is mounted includes a rectangular pixel region 2A provided in a central portion in a two-dimensional plane including the X direction and the Y direction orthogonal to each other, and a peripheral region 2B provided outside the pixel region 2A so as to surround the pixel region 2A.

The pixel region 2A is, for example, a light receiving surface that receives light collected by the optical lens (optical system) 102 illustrated in FIG. 12. Then, in the pixel region 2A, a plurality of pixels 3 is arranged in a matrix on the two-dimensional plane including the X direction and the Y direction. In other words, the pixels 3 are repeatedly arranged in each of the X direction and the Y direction orthogonal to each other in the two-dimensional plane.

As illustrated in FIG. 1, a plurality of bonding pads 14 is arranged in the peripheral region 2B. The plurality of bonding pads 14 is arranged along each of four sides in the two-dimensional plane of the semiconductor chip 2, for example. Each of the plurality of bonding pads 14 is an input/output terminal used when the semiconductor chip 2 is electrically connected to an external device.

<Logic Circuit>

Figure 2:
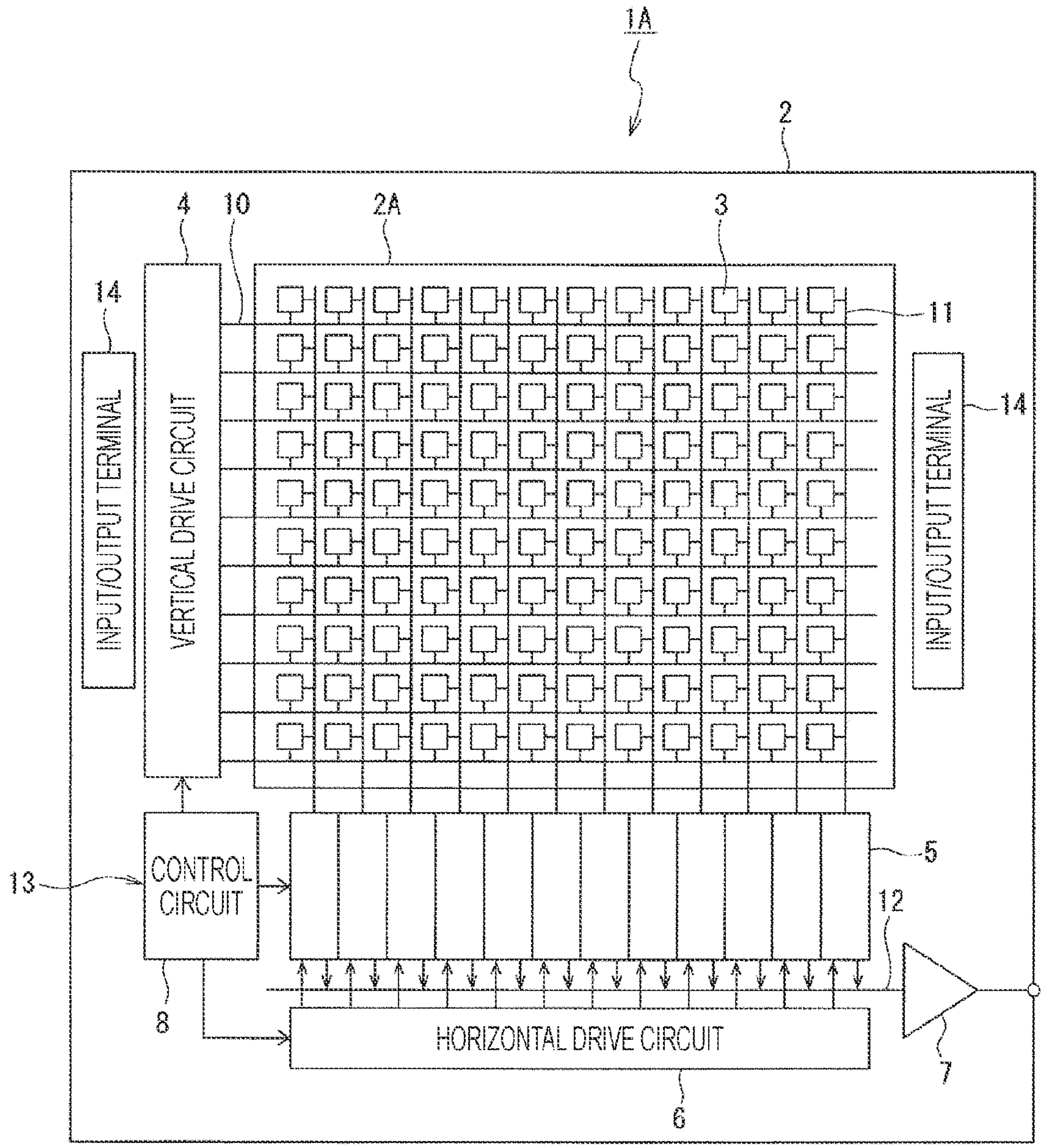
FIG. 2 is a block diagram illustrating a configuration example of the solid-state imaging device according to the first embodiment of the present technology.

As illustrated in FIG. 2, the semiconductor chip 2 includes a logic circuit 13 including a vertical drive circuit 4, column signal processing circuits 5, a horizontal drive circuit 6, an output circuit 7, a control circuit 8, and the like. The logic circuit 13 includes, for example, a complementary MOS (CMOS) circuit including an n-channel conductive metal oxide semiconductor field effect transistor (MOSFET) and a p-channel conductive MOSFET as field effect transistors.

The vertical drive circuit 4 includes, for example, a shift register. The vertical drive circuit 4 sequentially selects a desired pixel drive line 10, supplies a pulse for driving the pixel 3 to the selected pixel drive line 10, and drives the respective pixels 3 row by row. That is, the vertical drive circuit 4 selectively scans each of the pixels 3 in the pixel region 2A sequentially in the vertical direction in units of rows, and supplies a pixel signal from the pixel 3 based on a signal charge generated in accordance with the amount of received light by a photoelectric conversion element of each of the pixels 3 to the column signal processing circuit 5 through a vertical signal line 11.

The column signal processing circuits 5 are arranged, for example, for columns of the pixels 3, respectively, and perform signal processing such as noise removal on the signal output from the pixel 3 of one row for each pixel column. For example, the column signal processing circuit 5 performs signal processing such as correlated double sampling (CDS) and analog-digital (AD) conversion to remove fixed pattern noise unique to the pixel.

The horizontal drive circuit 6 includes, for example, a shift register. The horizontal drive circuit 6 sequentially outputs horizontal scanning pulses to the column signal processing circuits 5 to sequentially select each of the column signal processing circuits 5, and causes each of the column signal processing circuits 5 to output the pixel signal, which has been subjected to the signal processing, to a horizontal signal line 12.

The output circuit 7 performs signal processing on the pixel signals sequentially supplied from the respective column signal processing circuits 5 through the horizontal signal line 12, and outputs the processed pixel signals. As the signal processing, for example, buffering, black level adjustment, column variation correction, various digital signal processing, and the like can be used.

The control circuit 8 generates a clock signal and a control signal serving as references of operations of the vertical drive circuit 4, the column signal processing circuit 5, the horizontal drive circuit 6, and the like on the basis of a vertical synchronization signal, a horizontal synchronization signal, and a master clock signal. Then, the control circuit 8 outputs the generated clock signal and control signal to the vertical drive circuit 4, the column signal processing circuit 5, the horizontal drive circuit 6, and the like.

<Pixel>

Figure 3:
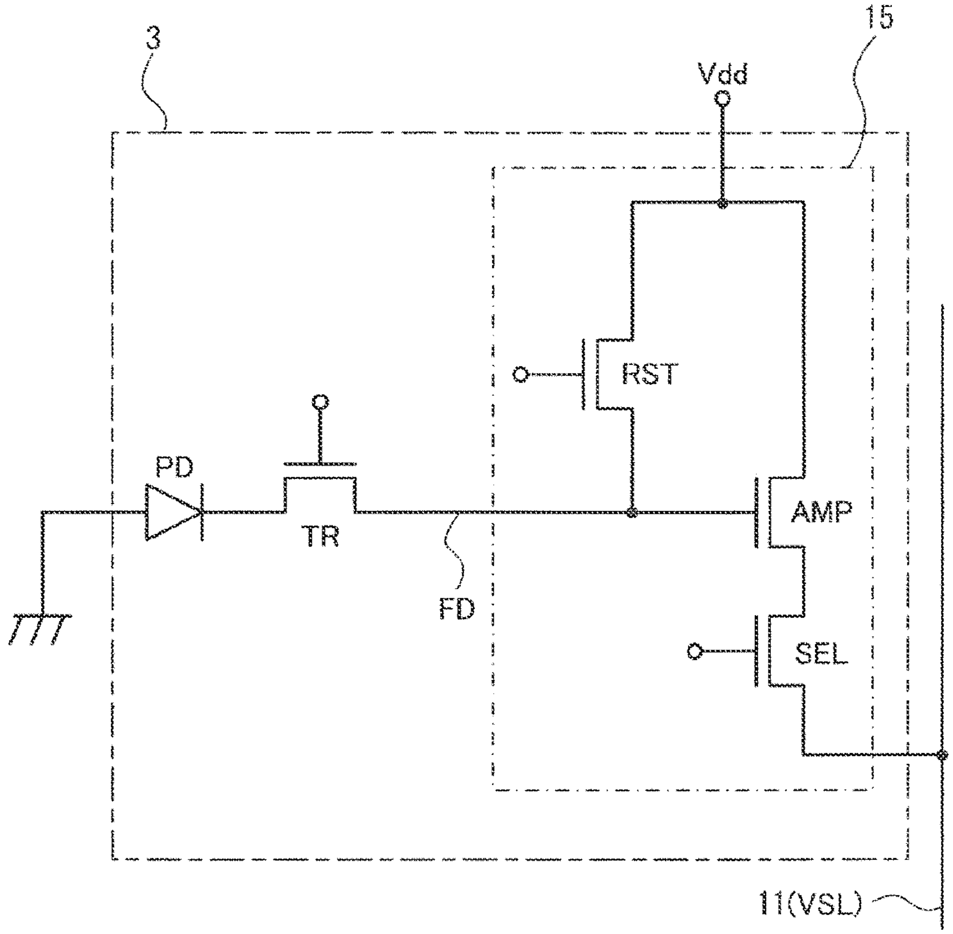
FIG. 3 is an equivalent circuit diagram of a pixel of the solid-state imaging device according to the first embodiment of the present technology.

As illustrated in FIG. 3, each pixel 3 of the plurality of pixels 3 includes: a photoelectric conversion element PD, a charge accumulation region (floating diffusion) FD that accumulates (holds) a signal charge photoelectrically converted by the photoelectric conversion element PD, and a transfer transistor TR that transfers the signal charge photoelectrically converted by the photoelectric conversion element PD to the charge accumulation region FD. Furthermore, each of the plurality of pixels 3 includes a read circuit 15 electrically connected to the charge accumulation region FD.

The photoelectric conversion element PD generates the signal charge corresponding to the amount of received light. The photoelectric conversion element PD is electrically connected to a source region of the transfer transistor TR on a cathode side, and is electrically connected to a reference potential line (for example, ground) on an anode side. As the photoelectric conversion element PD, for example, a photodiode is used.

The transfer transistor TR has a drain region that is electrically connected to the charge accumulation region FD. The transfer transistor TR has a gate electrode electrically connected to a transfer transistor drive line of the pixel drive line 10 (see FIG. 2). The charge accumulation region FD temporarily accumulates and holds the signal charge transferred from the photoelectric conversion element PD via the transfer transistor TR.

As illustrated in FIG. 3, the read circuit 15 reads the signal charge accumulated in the charge accumulation region FD, and outputs a pixel signal based on the signal charge. The read circuit 15 is not limited thereto, and includes, for example, an amplification transistor AMP, a selection transistor SEL, and a reset transistor RST as pixel transistors. These transistors (AMP, SEL, and RST) are configured using, for example, MOSFETs each having a gate insulating film including a silicon oxide film ($SiO_2$ film), a gate electrode, and a pair of main electrode regions functioning as a source region and a drain region. Furthermore, these transistors may also be configured using a metal insulator semiconductor FET (MISFET) having a silicon nitride film ($Si_3N_4$ film) or a laminated film of a silicon nitride film, a silicon oxide film, and the like as the gate insulating film.

The amplification transistor AMP has the source region electrically connected to the drain region of the selection transistor SEL, and the drain region electrically connected to a power supply line Vdd and the drain region of the reset transistor. Then, the gate electrode of the amplification transistor AMP is electrically connected to the charge accumulation region FD and the source region of the reset transistor RST.

The selection transistor SEL has the source region electrically connected to the vertical signal line 11 (VSL), and the drain electrically connected to the source region of the amplification transistor AMP. Then, the gate electrode of the selection transistor SEL is electrically connected to a selection transistor drive line of the pixel drive line 10 (see FIG. 2).

The reset transistor RST has the source region electrically connected to the charge accumulation region FD and the gate electrode of the amplification transistor AMP, and the drain region electrically connected to the power supply line Vdd and the drain region of the amplification transistor AMP. The gate electrode of the reset transistor RST is electrically connected to a reset transistor drive line of the pixel drive line 10 (see FIG. 2).

When the transfer transistor TR is turned on, the transfer transistor TR transfers the signal charge generated by the photoelectric conversion element PD to the charge accumulation region FD. When the reset transistor RST is turned on, the reset transistor RST resets a potential (signal charge) of the charge accumulation region FD to a potential of the power supply line Vdd. The selection transistor SEL controls an output timing of the pixel signal from the read circuit 15.

The amplification transistor AMP generates a signal of a voltage corresponding to a level of the signal charge held in the charge accumulation region FD as the pixel signal. The amplification transistor AMP forms a source follower amplifier, and outputs the pixel signal having the voltage corresponding to the level of the signal charge generated by the photoelectric conversion element PD. When the selection transistor SEL is turned on, the amplification transistor AMP amplifies a potential of the charge accumulation region FD and outputs a voltage corresponding to the amplified potential to the column signal processing circuit 5 via the vertical signal line 11 (VSL).

During the operation of the solid-state imaging device 1A according to the first embodiment, the signal charge generated by the photoelectric conversion element PD of the pixel 3 is accumulated in the charge accumulation region FD via the transfer transistor TR of the pixel 3. Then, the signal charge accumulated in the charge accumulation region FD is read by the read circuit 15 and applied to the gate electrode of the amplification transistor AMP of the read circuit 15. A selection control signal for a horizontal line is provided from a vertical shift register to the gate electrode of the selection transistor SEL of the read circuit 15. When the selection control signal is set to a high (H) level, the selection transistor SEL is energized, and a current corresponding to the potential of the charge accumulation region FD, which has been amplified by the amplification transistor AMP, flows through the vertical signal line 11. Furthermore, when a reset control signal applied to the gate electrode of the reset transistor RST of the read circuit 15 is set to a high (H) level, the reset transistor RST is energized, and the signal charge accumulated in the charge accumulation region FD is reset.

<<Specific Configuration of Solid-State Imaging Device>>

Next, a specific configuration of the solid-state imaging device 1A will be described with reference to FIGS. 4, 5A, and 5B.

Figure 4:
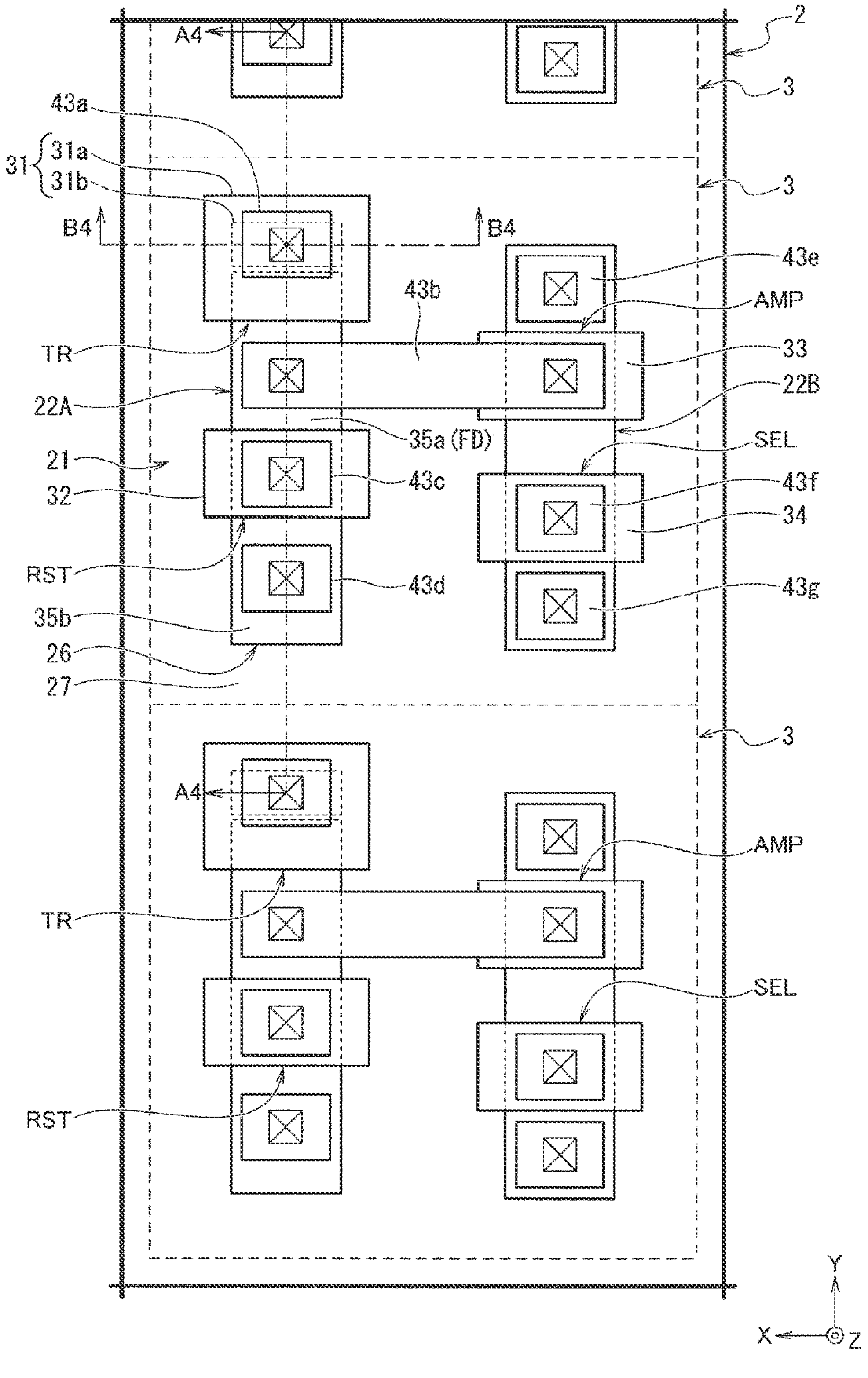
FIG. 4 is a plan layout diagram schematically illustrating a configuration example of the pixel of the solid-state imaging device according to the first embodiment of the present technology.
Figure 5A:
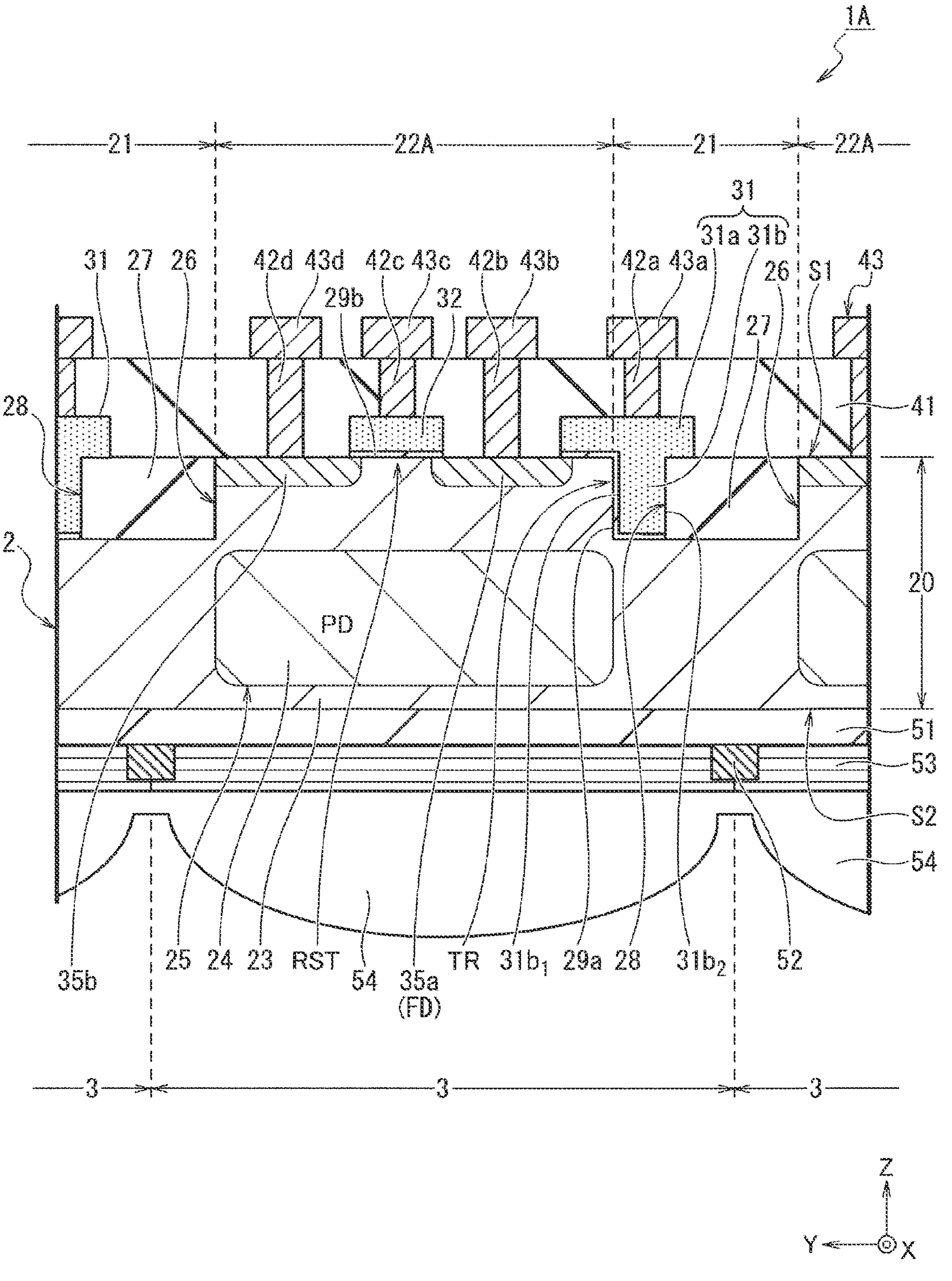
FIG. 5A is a cross-sectional view schematically illustrating a cross-sectional structure taken along a line A4-A4 in FIG. 4.
Figure 5B:
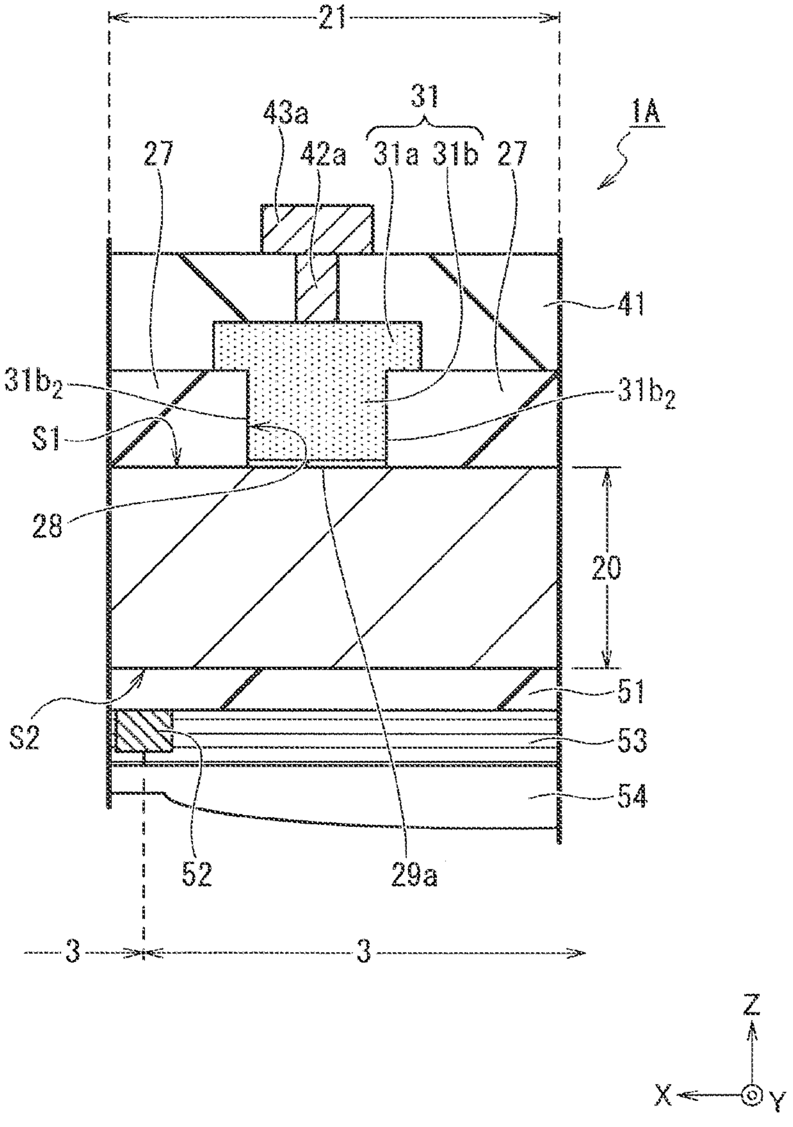
FIG. 5B is a cross-sectional view schematically illustrating a cross-sectional structure taken along a line B4-B4 in FIG. 4.

Note that, in FIGS. 4, 5A, and 5B, the upper and lower sides are inverted from those of FIG. 1 in order to make the drawings easy to see. Furthermore, illustrations of upper layers of wirings 43 as described later are omitted in FIGS. 5A and 5B.

<Semiconductor Chip>

As illustrated in FIGS. 5A and 5B, the semiconductor chip 2 includes a semiconductor layer 20 having a first surface S1 and a second surface S2 located on mutually opposite sides, and a multilayer wiring layer including an interlayer insulating film 41 and a wiring layer 43 provided on the first surface S1 side of the semiconductor layer 20. Furthermore, on the second surface S2 side of the semiconductor layer 20, the semiconductor chip 2 includes a planarization film 51, a light shielding film 52, a color filter 53, and a microlens (on-chip lens) 54 which are sequentially provided from the second surface S2 side.

The semiconductor layer 20 includes, for example, a p-type single crystal silicon substrate. Then, a p-type semiconductor region 23 is provided in the semiconductor layer 20. The p-type semiconductor region 23 is a well region formed from the first surface S1 side to the second surface S2 side of the semiconductor layer 20.

The planarization film 51 is provided on the second surface S2 side of the semiconductor layer 20 so as to cover the second surface S2 of the semiconductor layer 20, and planarizes the second surface S2 side of the semiconductor layer 20. In the light shielding film 52, a planar pattern in the plan view is a lattice-shaped planar pattern so as to divide the adjacent pixels 3.

The color filter 53 and the microlens 54 are provided for each of the pixels 3. The color filter 53 separates colors of incident light incident from a light incident surface side of the semiconductor chip 2. The microlens 54 collects irradiation light and makes the collected light efficiently incident on the pixel 3.

Here, the first surface S1 of the semiconductor layer 20 is sometimes referred to as an element formation surface or a main surface, and the second surface S2 is sometimes referred to as the light incident surface or a back surface. In the solid-state imaging device 1A of the first embodiment, light incident from the second surface (light incident surface or back surface) S2 side of the semiconductor layer 20 is photoelectrically converted by photoelectric conversion units 25 (the photoelectric conversion elements PD) provided in the semiconductor layer 20.

(Photoelectric Conversion Unit)

As illustrated in FIG. 5A, the semiconductor layer 20 is provided with the photoelectric conversion unit 25 for each of the pixels 3. The photoelectric conversion units 25 are provided to be separated in a depth direction (the Z direction) from the charge accumulation region FD provided in a surface layer part on the first surface S1 side of the semiconductor layer 20. The photoelectric conversion unit 25 includes the photoelectric conversion element PD described above. Then, the photoelectric conversion element PD includes the p-type semiconductor region (well region) 23 and an n-type semiconductor region 24 buried in the p-type semiconductor region 23.

The n-type semiconductor region 24 is provided for each of the pixels 3. Then, the n-type semiconductor region 24 has a rectangular planar shape so as to overlap active regions 22A and 22B and an isolation region 21 as described later in one pixel 3 in the plan view although not illustrated in detail.

(Active Region)

As illustrated in FIGS. 4, 5A, and 5B, the semiconductor layer 20 has the active regions (element formation regions) 22A and 22B which are formed in island shapes and defined by the isolation region 21 on the first surface S1 side. The active regions 22A and 22B are provided for each of the pixels 3. FIG. 4 illustrates an example in which three pixels 3 are repeatedly arranged in the Y direction, but the number of pixels 3 is not limited thereto.

As illustrated in FIG. 4, the active regions 22A and 22B extend in the X direction and are provided side by side in the Y direction with the isolation region 21 interposed therebetween. Then, a planar shape in the plan view of each of the active regions 22A and 22B is, for example, an oblong shape (band shape).

As illustrated in FIGS. 4 and 5A, the isolation region 21 includes an isolation trench 26 provided on the first surface S1 side of the semiconductor layer 20 and an isolation insulating film 27 provided in the isolation trench 26. That is, each of the active regions 22A and 22B of the semiconductor layer 20 is defined into the island shape by the isolation trench 26 and the isolation insulating film 27. The isolation region 21 has, but is not limited to, a shallow trench isolation (STI) structure in which the isolation trench 26 is formed in the surface layer part on the first surface S1 side of the semiconductor layer 20, and the isolation insulating film 27 is selectively embedded in the isolation trench 26, for example. The isolation insulating film 27 is configured using, for example, a deposited film including a silicon oxide film deposited by a CVD method. Here, a thermal oxide film has a denser film quality than the deposited film.

<Pixel Transistor>

As illustrated in FIG. 4, the transfer transistor TR and the reset transistor RST are configured in the active region 22A. Furthermore, the amplification transistor AMP and the selection transistor SEL are configured in the active region 22B.

(Reset Transistor)

As illustrated in FIG. 5A, the reset transistor RST is configured in a surface layer part of the active region 22A. The reset transistor RST includes: a gate insulating film 29*b* provided on the first surface S1 side of the semiconductor layer 20; a gate electrode 32 provided on the first surface S1 side of the semiconductor layer 20 with the gate insulating film 29*b* interposed therebetween; and a channel formation region provided in the semiconductor layer 20 (specifically, the p-type semiconductor region 23) immediately below the gate electrode 32. Furthermore, the reset transistor RST includes: a pair of main electrode regions 35*a* and 35*b* provided in the p-type semiconductor region 23 of the semiconductor layer 20 to be separated from each other in a channel length direction with the channel formation region, immediately below the gate electrode 32, interposed therebetween, and functioning as the source region and the drain region.

The gate insulating film 29*b* includes, for example, a thermal oxide film formed by thermally oxidizing the semiconductor layer 20. The thermal oxide film includes, for example, a silicon oxide film. The gate electrode 32 includes, for example, a polycrystalline silicon film (doped polysilicon film) into which an impurity for reducing a resistance value is introduced. The pair of main electrode regions 35*a* and 35*b* includes, for example, a pair of n-type semiconductor regions formed by self-alignment with respect to the gate electrode 32. That is, the reset transistor RST is configured using a MOSFET of an n-channel conductivity type. The main electrode region 35*a*, which is one of the pair of main electrode regions 35*a* and 35*b*, functions as the charge accumulation region FD described above.

(Transfer Transistor)

As illustrated in FIG. 5A, the transfer transistor TR is configured in the surface layer part of the active region 22A. The transfer transistor TR includes: a gate electrode 31 provided in the isolation region 21; a gate insulating film 29*a* interposed between the gate electrode 31 and the semiconductor layer 20; and the p-type semiconductor region 23 functioning as a channel formation region where a channel is formed. Furthermore, the transfer transistor TR includes a pair of main electrode regions functioning as the source region and the drain region. One main electrode region of the pair of main electrode regions is configured using the n-type semiconductor region 24 (photoelectric conversion unit 25), and the other main electrode region is configured using the main electrode region 35*a* (charge accumulation region FD) of the reset transistor RST. That is, the transfer transistor TR and the reset transistor RST share the main electrode region 35*a* (charge accumulation region FD) functioning as the drain region of the transfer transistor TR and the main electrode region 35*a* (charge accumulation region FD) functioning as the source region of the reset transistor RST.

The gate insulating film 29*a* is formed in the same process as the gate insulating film 29*b*, for example, and includes a thermal oxide film formed by thermally oxidizing the semiconductor layer 20 similarly to the gate insulating film 29*b*. The gate electrode 31 is formed in the same process as the gate electrode 32, for example, and includes a doped polysilicon film similarly to the gate electrode 32. That is, the transfer transistor TR is configured using a MOSFET of an n-channel conductivity type similarly to the reset transistor RST.

As illustrated in FIGS. 4, 5A, and 5B, the gate electrode 31 includes: a head 31*a* provided on the first surface S1 side of the semiconductor layer 20; and a trunk (embedded part) 31*b* protruding from the head 31*a* to the inside of the isolation insulating film 27 so as to be narrower than the head 31*a*. That is, the gate electrode 31 is formed in a T shape. Then, the transfer transistor TR has a vertical structure.

The head 31*a* has a rectangular planar shape in the plan view (see FIG. 4), and is provided over the isolation region 21 and the active region 22A of the semiconductor layer 20. Then, the gate insulating film 29*a* is interposed between an overhanging part of the head 31*a* and the active region 22A (see FIG. 5A).

The trunk 31*b* is provided inside the gate trench 28 provided in the isolation insulating film 27, and has a rectangular cross-sectional shape orthogonal to the thickness direction (Z direction) of the semiconductor layer 20 (see FIG. 4). Then, the trunk 31*b* includes a first portion 31$b_1$ adjacent to (facing) the semiconductor layer 20 in the active region 22A with the gate insulating film 29*a* interposed therebetween, and a second portion 31$b_2$ adjacent to (facing) the isolation insulating film 27. Since the cross-sectional shape, orthogonal to the thickness direction (Z direction) of the semiconductor layer 20, of the trunk 31*b* of the first embodiment is rectangular, one side wall among four side walls surrounding the trunk 31*b* serves as the first portion 31$b_1$, and the remaining three side walls serve as the second portion 31$b_2$.

That is, as illustrated in FIG. 5A, in the trunk 31*b*, a first side wall out of the first side wall and a second side wall located on mutually opposite sides in the Y direction serves as the first portion 31$b_1$ adjacent to the semiconductor layer 20 in the active region 22A with the gate insulating film 29*a* interposed therebetween, and the second side wall on the opposite side to the first side wall serves as the second portion 31$b_2$ adjacent to the isolation insulating film 27. Then, as illustrated in FIG. 5B, in the trunk 31*b*, each of a third side wall and a fourth side wall located on mutually opposite sides in the X direction serves as the second portion 31$b_2$ adjacent to the isolation insulating film 27. In other words, in the trunk 31*b*, each of the side walls in three directions, except for the side wall in one direction adjacent to the semiconductor layer 20 with the gate insulating film 29*a* interposed therebetween, among the side walls in four directions is surrounded by the isolation insulating film 27 which is thicker in a direction orthogonal to the thickness direction of the semiconductor layer 20 than a film thickness of the gate insulating film 29*a*.

Since the trunk 31*b* of the gate electrode 31 has the first portion 31$b_1$ adjacent to the semiconductor layer 20 in the active region 22A with the gate insulating film 29*a* interposed therebetween and the second portion 31$b_2$ adjacent to the isolation insulating film 27 in this manner, a capacitance component (parasitic capacitance) added to the gate electrode 31 can be reduced as compared with a conventional case where the periphery of the trunk 31*b* of the gate electrode 31, that is, all the side walls in the four directions are adjacent to the semiconductor layer 20 with the gate insulating film 29*a* interposed therebetween.

As illustrated in FIGS. 4 and 5A, the trunk 31*b* of the gate electrode 31 is provided outside one end side in a longitudinal direction (the Y direction) of the active region 22A. Then, the first portion 31*b*1 and the second portion 31*b*2 of the gate electrode 31 are provided outside the one end side in the longitudinal direction of the active region in the plan view.

As illustrated in FIG. 5A, the gate insulating film 29*a* is provided from the active region 22A to the side wall and a bottom wall in the gate trench 28. Then, the gate insulating film 29*a* is interposed between the semiconductor layer 20 in the active region 22A and the head 31*a* of the gate electrode 31, and is also interposed between the semiconductor layer 20 in the gate trench 28 and the side wall and the bottom wall of the trunk 31*b* of the gate electrode 31. Then, a gate length of the trunk 31*b* of the gate electrode 31 is specified by a depth of the gate trench 28 in the Z direction. Therefore, a variation in transfer characteristics of the transfer transistor TR having the vertical structure increases as a variation in the depth direction of the gate trench 28 increases.

(Amplification Transistor and Selection Transistor)

As illustrated in FIG. 4, the amplification transistor AMP and the selection transistor SEL are provided in series in a surface layer part of the active region 22B. The amplification transistor AMP and the selection transistor SEL are configured using a MOSFET of an n-channel conductivity type similarly to the reset transistor RST, and basically have a configuration similar to that of the reset transistor RST. Therefore, the description regarding specific configurations of the amplification transistor AMP and the selection transistor SEL will be omitted.

Note that FIG. 4 illustrates a gate electrode 33 of the amplification transistor AMP and a gate electrode 34 of the selection transistor SEL. The amplification transistor AMP and the selection transistor SEL share a main electrode region functioning as the source region of the amplification transistor AMP and a main electrode region functioning as the drain region of the selection transistor SEL.

(Multilayer Wiring Layer)

As illustrated in FIGS. 5A and 5B, the gate electrodes 31 and 32 of the transfer transistor TR and the reset transistor RST are covered with the interlayer insulating film 41 provided on the first surface S1 side of the semiconductor layer 20. Furthermore, the gate electrodes 33 and 34 of the amplification transistor AMP and the selection transistor SEL are also covered with the interlayer insulating film 41 although not illustrated in detail.

Then, the wiring layer 43 on the interlayer insulating film 41 is provided with wirings 43*a*, 43*b*, 43*c*, and 43*d* as illustrated in FIGS. 5A and 5B, and is provided with wirings 43*e*, 43*f*, and 43*g* illustrated in FIG. 4. Then, these wirings 43*a* to 43*g* are covered with an interlayer insulating film provided on the interlayer insulating film 41 although not illustrated.

The wiring 43*a* is electrically connected to the gate electrode 31 of the transfer transistor TR via a contact electrode 42*a* embedded in the interlayer insulating film 41 as illustrated in FIGS. 4, 5A, and 5B.

The wiring 43*b* extends over the active regions 22A and 22B in the plan view as illustrated in FIG. 4. Then, the wiring 43*b* is electrically connected to the main electrode region 35*a* (charge accumulation region FD) of each of the reset transistor RST and the transfer transistor TR via a contact electrode 42*b* embedded in the interlayer insulating film 41 as illustrated in FIGS. 4 and 5A.

The wiring 43*c* is electrically connected to the gate electrode 32 of the reset transistor RST via a contact electrode 42*c* embedded in the interlayer insulating film 41 as illustrated in FIGS. 4 and 5A. The wiring 43*d* is electrically connected to the main electrode region 35*b* of the reset transistor via a contact electrode 42*d* embedded in the interlayer insulating film 41.

The wiring 43*e* illustrated in FIG. 4 is electrically connected to the main electrode region functioning as the drain region of the amplification transistor AMP via a contact electrode embedded in the interlayer insulating film 41 although not illustrated in detail.

The wiring 43*f* illustrated in FIG. 4 is electrically connected to the gate electrode 34 of the selection transistor SEL via a contact electrode embedded in the interlayer insulating film 41 although not illustrated in detail.

The wiring 43*g* illustrated in FIG. 4 is electrically connected to the main electrode region functioning as the source region of the selection transistor SEL via a contact electrode embedded in the interlayer insulating film 41 although not illustrated in detail. The wiring 43*g* is electrically connected to the vertical signal line 11 (VSL) illustrated in FIG. 3. Each of wiring 43*d* and wiring 43*e* is electrically connected to the power supply line Vdd illustrated in FIG. 3.

In the solid-state imaging device 1A having the above configuration, incident light is emitted from the microlens 54 side of the semiconductor chip 2, the emitted incident light is sequentially transmitted through the microlens 54 and the color filter 53, and the transmitted light is photoelectrically converted by the photoelectric conversion unit 25 (photoelectric conversion element PD), thereby generating a signal charge. Then, the generated signal charge is output as a pixel signal from the vertical signal line 11 formed in a multilayer wiring layer 40 via the transfer transistor TR and the read circuit 15 provided on the first surface S1 side of the active regions 22A and 22B of the semiconductor layer 20.

<<Method for Manufacturing Solid-State Imaging Device>>

Next, a method for manufacturing the solid-state imaging device 1A will be described with reference to FIGS. 6A to 6G.

In the first embodiment, manufacturing processes of the photoelectric conversion unit 25, the transfer transistor TR, and the reset transistor RST included in a manufacturing process of the solid-state imaging device 1A will be mainly described.

Figure 6A:
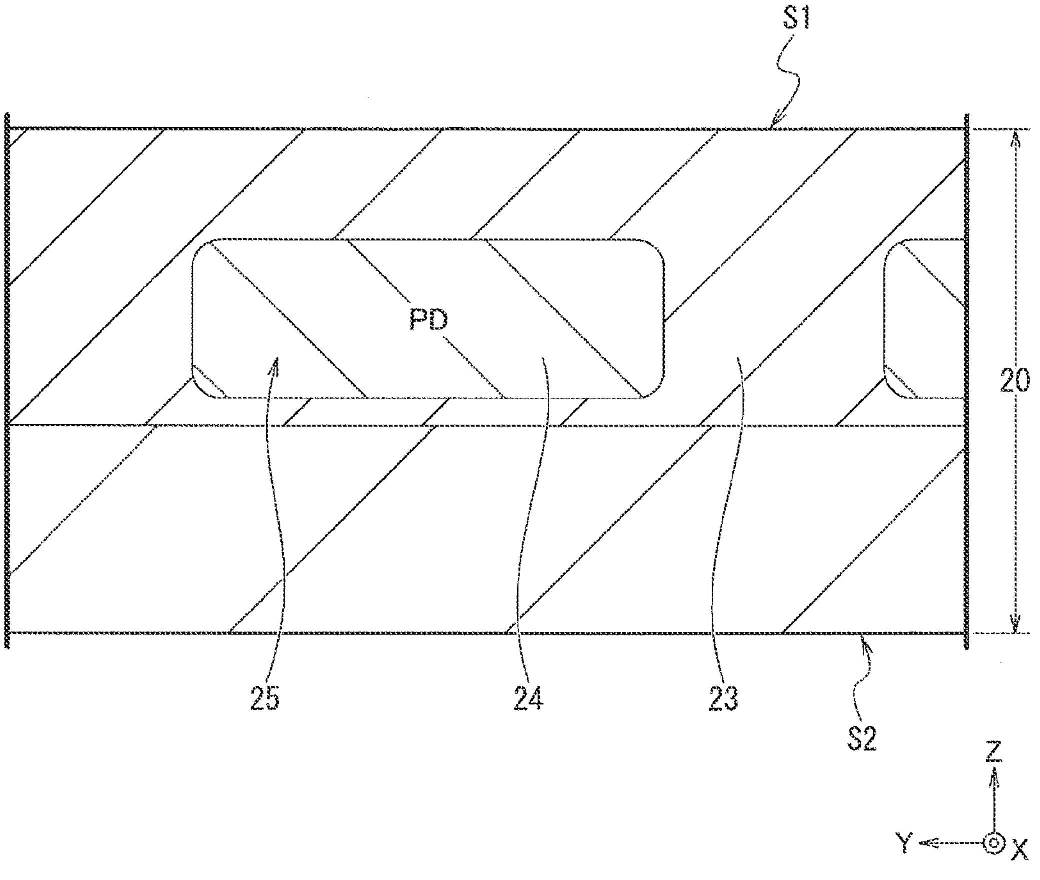
FIG. 6A is a process cross-sectional view illustrating a method for manufacturing the solid-state imaging device according to the first embodiment of the present technology.

First, the photoelectric conversion unit 25 is formed in the semiconductor layer 20 having the first surface S1 and the second surface S2 located on mutually opposite sides as illustrated in FIG. 6A. The photoelectric conversion unit 25 is formed by forming the p-type semiconductor region (well region) 23, which extends in the depth direction (Z direction) from the first surface S1 side, on the first surface S1 side of the semiconductor layer 20, and thereafter, selectively forming the n-type semiconductor regions 24 inside the p-type semiconductor region 23. The photoelectric conversion unit 25 is formed to be separated from the first surface S1 of the semiconductor layer 20 in the depth direction (Z direction). Then, the photoelectric conversion unit 25 is formed for each of the pixels 3.

Figure 6B:
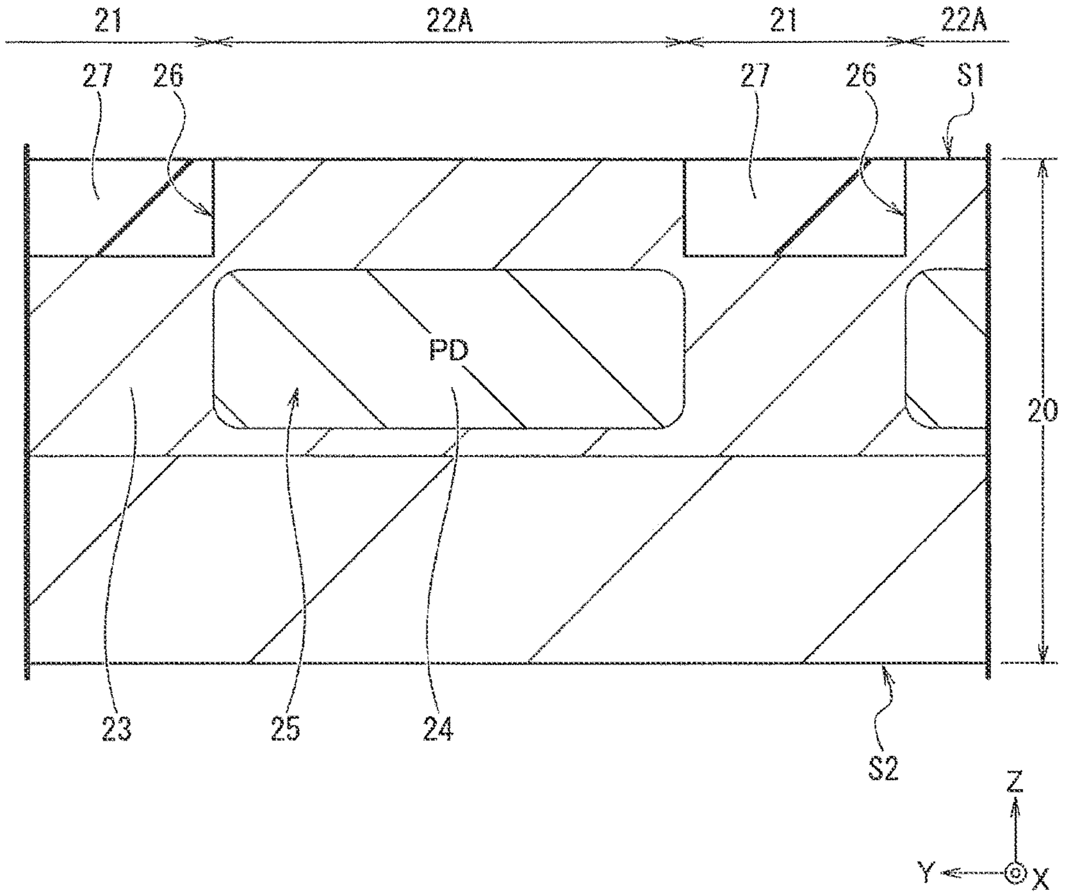
FIG. 6B is a process cross-sectional view following FIG. 6A.

Next, on the first surface S1 side of the semiconductor layer 20, the active region 22A defined by the isolation region 21 is formed as illustrated in FIG. 6B, and the active region 22B defined by the isolation region 21 is formed although not illustrated. The active regions 22A and 22B are defined by forming the isolation region 21 using, for example, a well-known STI technology. Specifically, the isolation trench 26 is formed on the first surface S1 side of the semiconductor layer 20, thereafter, the isolation insulating film 27 including, for example, a silicon oxide film as a deposited film is formed by a CVD method on the first surface S1 side of the semiconductor layer 20 so as to fill the inside of the isolation trench 26, and thereafter, the isolation insulating film 27 on the first surface S1 of the semiconductor layer 20 is ground and removed by a CMP method such that the isolation insulating film 27 selectively remains in the isolation trench 26 to form the isolation region 21, whereby the active regions 22A and 22B defined by the isolation region 21 are formed. The active regions 22A and 22B are formed for each of the pixels 3. Then, the active regions 22A and 22B are formed so as to overlap the photoelectric conversion unit 25 in one pixel 3 in the plan view.

Figure 6C:
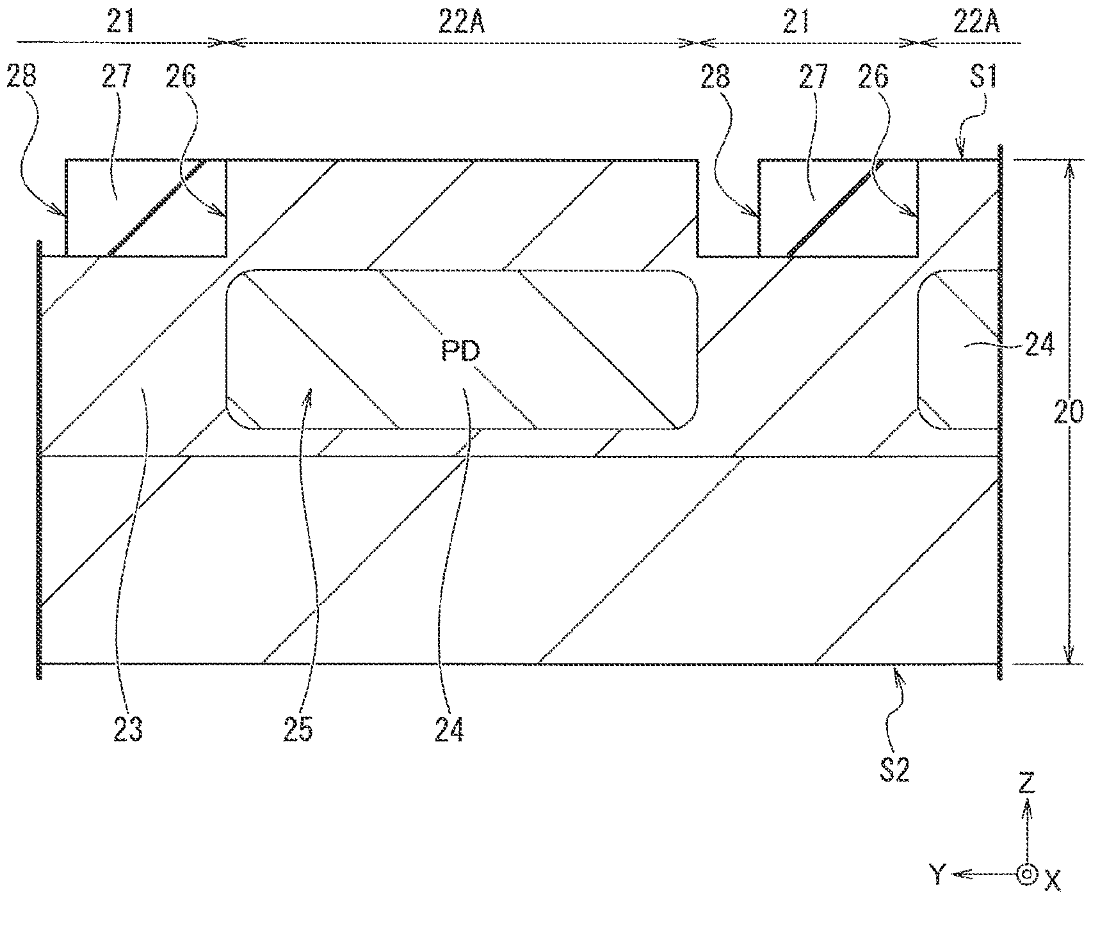
FIG. 6C is a process cross-sectional view following FIG. 6B.

Next, as illustrated in FIG. 6C, the gate trench 28 surrounded by the semiconductor layer 20 in the active region 22A and the isolation insulating film 27 is formed in the isolation region 21 on one end side in the longitudinal direction of the active region 22A. The gate trench 28 is formed by selectively etching the isolation insulating film 27 in the depth direction (Z direction) of the isolation region 21. For the etching of the isolation insulating film 27, a dry etching method or a wet etching method can be used. The isolation insulating film 27 is etched under a condition for achieving an etching selectivity with respect to the semiconductor layer 20. That is, the etching is performed under the condition that enables the isolation insulating film 27 to be etched at a higher etching rate than the semiconductor layer 20.

In this process, the gate trench 28 is formed by etching the isolation insulating film 27 under the condition that enables the etching rate of the isolation insulating film 27 to be higher than that of the semiconductor layer 20, so that the semiconductor layer 20 located immediately below the isolation region 21 serves as an etching stopper, and the variation in the depth direction (Z direction) of the gate trench 28 can be suppressed as compared with a case where a gate trench is formed in an active region of a semiconductor layer as in the related art.

Figure 6D:
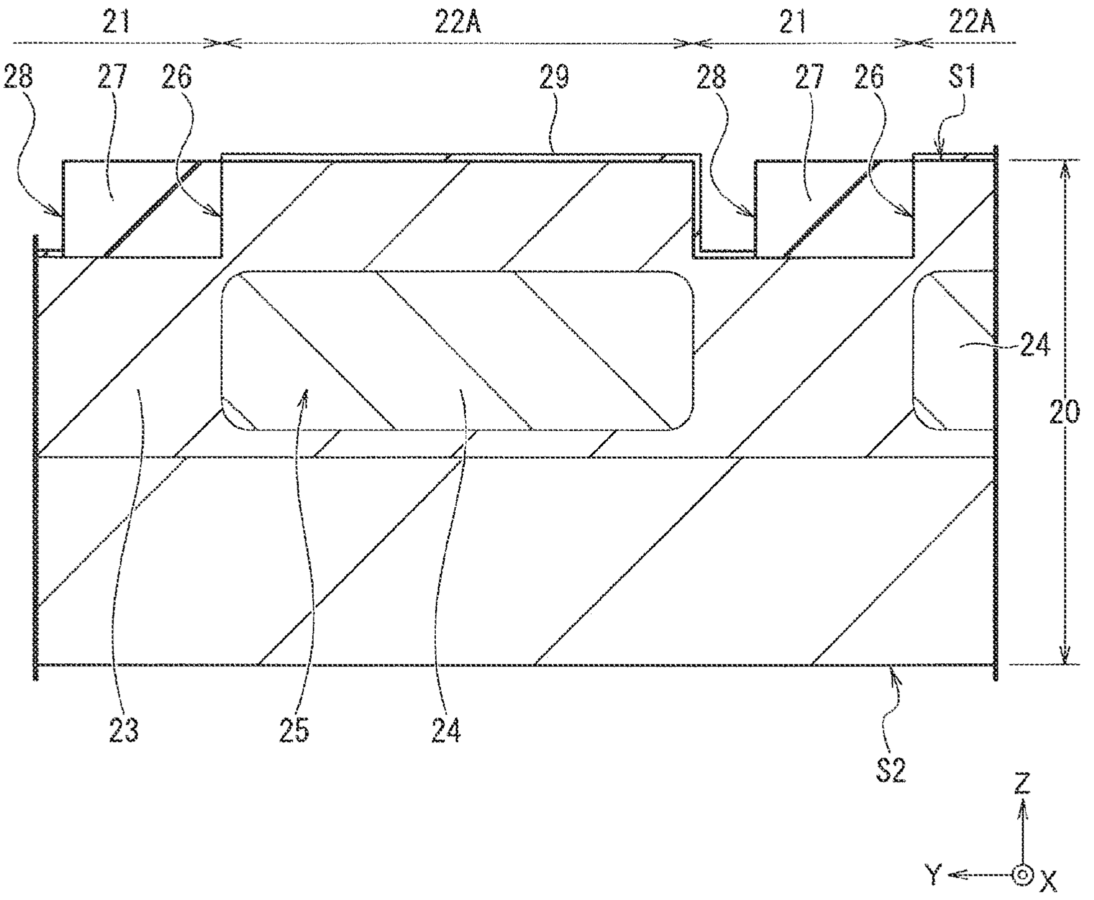
FIG. 6D is a process cross-sectional view following FIG. 6C.

Next, as illustrated in FIG. 6D, the gate insulating film 29 including a thermal oxide film is formed on the surface (first surface S1) of the semiconductor layer 20 in the active region 22A and the surface of the semiconductor layer 20 in the gate trench 28. The gate insulating film 29 is formed by performing a thermal oxidation treatment to oxidize the surface of the semiconductor layer 20 in the active region 22A and the surface of the semiconductor layer 20 in the gate trench 28. The gate insulating film 29 includes, for example, a silicon oxide film. The gate insulating film 29 is formed from the active region 22A to the side wall and the bottom wall in the gate trench 28. The gate insulating film 29 is used as the gate insulating film 29*a* of the transfer transistor TR and the gate insulating film 29*b* of the reset transistor RST in the active region 22A.

In this process, three side walls among the four side walls in the gate trench 28 include the isolation insulating film 27, and the remaining one side wall and the bottom wall include the gate insulating film 29.

Note that the gate insulating film 29 including a thermal oxide film is also formed on the surface (first surface S2) of the semiconductor layer 20 in the active region 22B in this process although not illustrated.

Figure 6E:
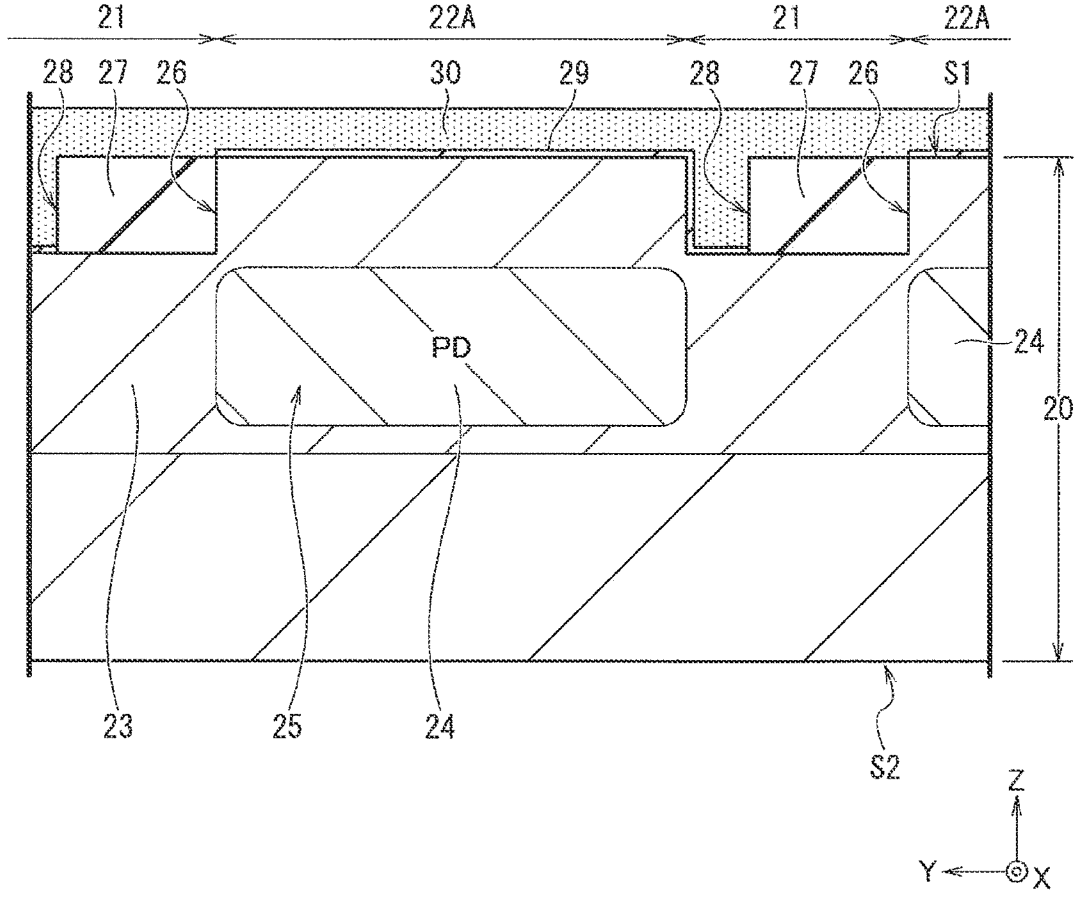
FIG. 6E is a process cross-sectional view following FIG. 6D.

Next, as illustrated in FIG. 6E, for example, a polycrystalline silicon film 30 is formed as a gate material on the entire surface on the first surface S1 side of the semiconductor layer 20 including the inside of the gate trench 28 by a CVD method. Impurities that reduce a resistance value are introduced into the polycrystalline silicon film 30 during its deposition or after the deposition.

Figure 6F:
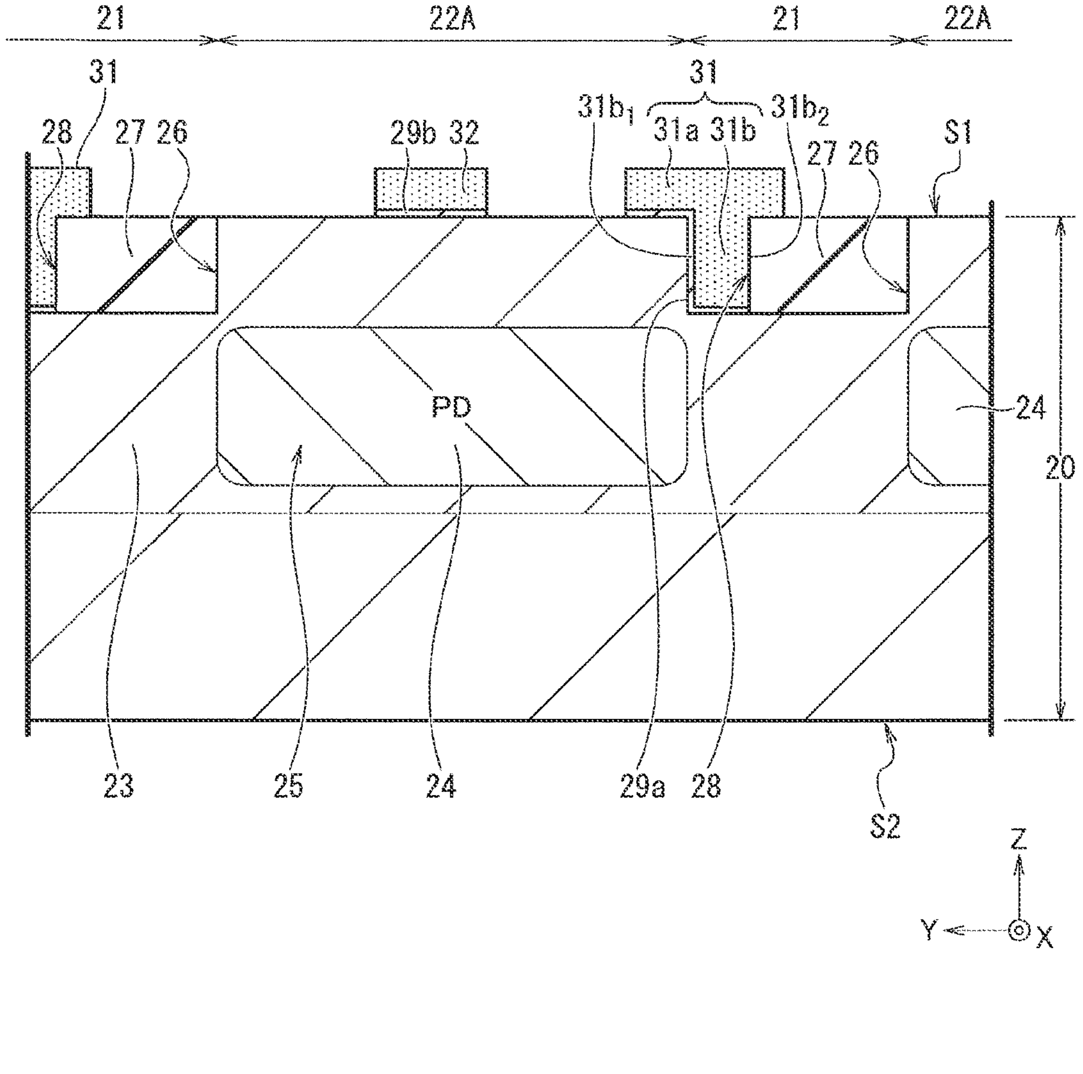
FIG. 6F is a process cross-sectional view following FIG. 6E.

Next, the polycrystalline silicon film 30 and the gate insulating film 29 are patterned into predetermined shapes to form the gate electrode 31 in the isolation region 21 and to form the gate electrode 32 in the active region 22A as illustrated in FIG. 6F. The gate electrode 32 is formed on the first surface S1 side of the semiconductor layer 20 with the gate insulating film 29*b* interposed therebetween in the active region 22A.

The gate electrode 31 includes the head 31*a* provided on the first surface S1 side of the semiconductor layer 20, and the trunk (embedded part) 31*b* which protrudes from the head 31*a* to be embedded in the gate trench 28 of the isolation insulating film 27 and is narrower than the head 31*a*. The head 31*a* has a rectangular planar shape in the plan view (see FIG. 4), and is formed over the isolation region 21 and the active region 22 of the semiconductor layer 20. Then, the gate insulating film 29*a* is interposed between the overhanging part of the head 31*a* and the active region 22.

The trunk 31*b* is formed to have a rectangular cross-sectional shape orthogonal to the thickness direction (Z direction) of the semiconductor layer 20. Then, the trunk 31*b* includes the first portion 31$b_1$ adjacent to (facing) the semiconductor layer 20 in the active region 22A with the gate insulating film 29*a* interposed therebetween, and the second portion 31$b_2$ adjacent to (facing) the isolation insulating film 27. Since the cross-sectional shape, orthogonal to the thickness direction (Z direction) of the semiconductor layer 20, of the trunk 31*b* of the first embodiment is rectangular, one side wall among the four side walls around the trunk 31*b* serves as the first portion 31$b_1$ adjacent to the semiconductor layer 20 in the active region 22A with the gate insulating film 29*a* interposed therebetween, and the remaining three side walls serve as the second portion 31$b_2$ adjacent to the isolation insulating film 27.

In this process, a variation in the depth direction of the trunk 31*b* of the gate electrode 31 depends on the variation in the depth direction of the gate trench 28. That is, when a dimension in the depth direction of the gate trench 28 varies, a dimension in the depth direction of the trunk 31*b* also varies. However, the variation in the depth direction of the gate trench 28 is suppressed since the semiconductor layer 20 located immediately below the isolation region 21 serves as the etching stopper when the isolation insulating film 27 is etched to form the gate trench 28 as described above. Therefore, the variation in the depth direction of the trunk 31*b* of the gate electrode 31 is also suppressed depending on the suppression of the variation in the depth direction of the gate trench 28.

Note that, in this process, each of the gate electrode 33 (see FIG. 4) of the amplification transistor AMP and the gate electrode 34 (see FIG. 4) of the selection transistor SEL is formed on the first surface S1 side of the active region 22B with a gate insulating film interposed therebetween although not illustrated.

Figure 6G:
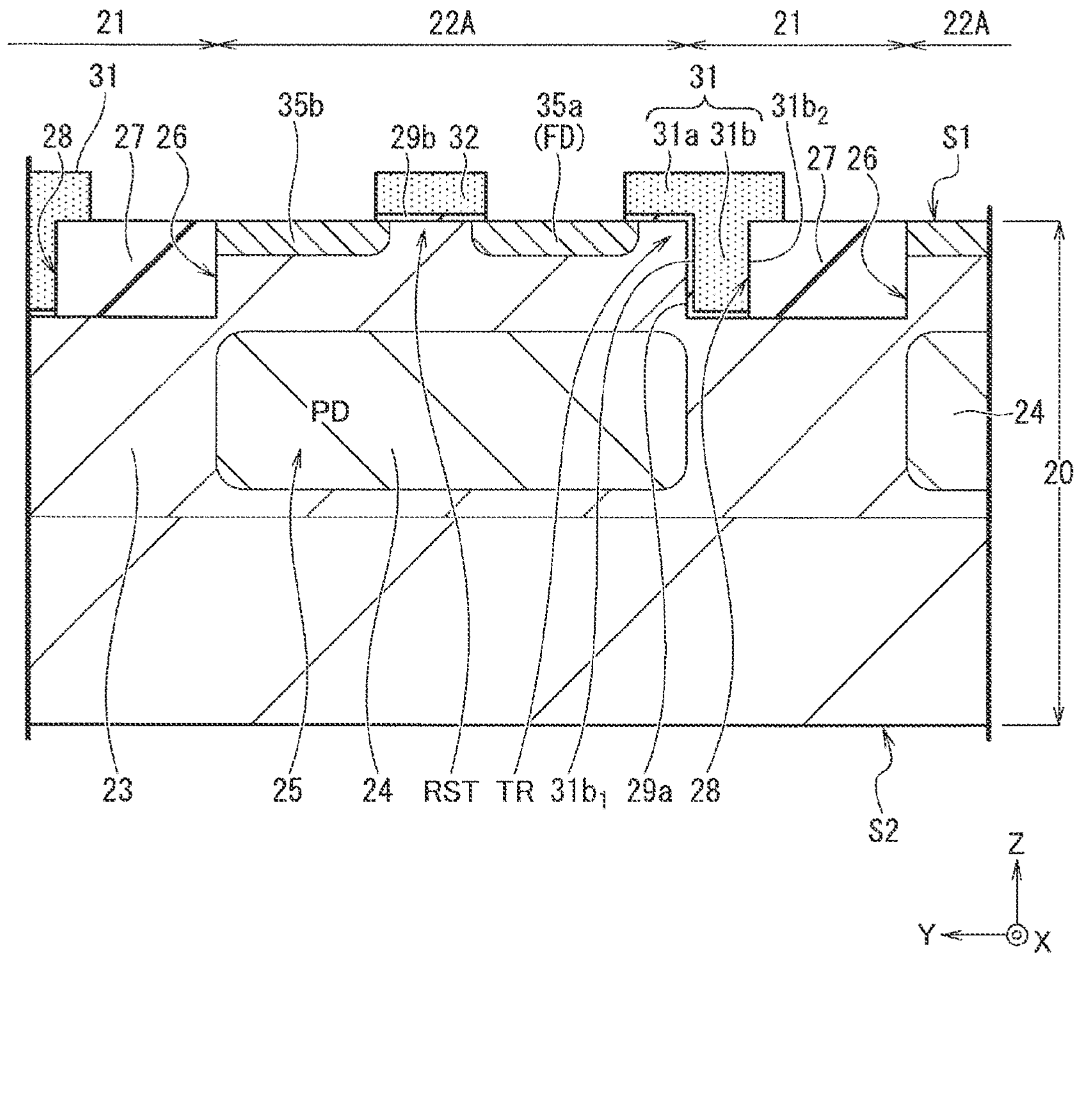
FIG. 6G is a process cross-sectional view following FIG. 6F.

Next, the pair of main electrode regions 35*a* and 35*b* including n-type semiconductor regions is formed in the surface layer part of the active region 22A on the first surface S1 side as illustrated in FIG. 6G. The pair of main electrode regions 35*a* and 35*b* is formed by selectively ion-implanting, for example, arsenic ions ($As^+$) or phosphorus ions ($P^+$) as n-type impurities into the active region 22A using the gate electrode 31, the gate electrode 32, and the isolation insulating film 27 of the isolation region 21 as masks for impurity introduction, and thereafter, subjecting the ion-implanted impurities to a heat treatment for activating the ion-implanted impurities. The main electrode region 35*a* is formed by self-alignment with respect to the gate electrodes 31 and 32. The main electrode region 35*b* is formed by self-alignment with respect to the gate electrode 32.

Through this process, the reset transistor RST including the p-type semiconductor region 23 functioning as the channel formation region, the gate insulating film 29*b*, the gate electrode 32, and the pair of main electrode regions 35*a* and 35*b* functioning as the source region and the drain region is formed in the active region 22A. Furthermore, the transfer transistor TR including the p-type semiconductor region 23 functioning as the channel formation region, the gate insulating film 29*a*, the gate electrode 31, and the n-type semiconductor region 24 and the main electrode region 35*a* functioning as the source region and the drain region is formed. The main electrode region 35*a* shares the source region of the reset transistor RST and the drain region of the transfer transistor TR. Then, the main electrode region 35*a* also functions as the charge accumulation region FD.

Note that, in this process, a pair of main electrode regions including n-type semiconductor regions is also formed in the surface layer part of the active region 22B on the first surface S1 side although not illustrated. Then, the amplification transistor AMP and the selection transistor SEL are formed in the active region 22B.

Thereafter, a multilayer wiring layer including the interlayer insulating film 41, the wiring layer 43, and the like is formed on the first surface side of the semiconductor layer, thereafter, the second surface S2 side of the semiconductor layer 20 is ground or polished by, for example, a CMP method to reduce a thickness of the semiconductor layer, and thereafter, the planarization film 51, the light shielding film 52, the color filter 53, and the microlens 54 are sequentially formed on the second surface S2 side of the semiconductor layer 20. Therefore, the solid-state imaging device 1A illustrated in FIG. 5A is almost completed.

Main Effects of First Embodiment

Next, main effects of the first embodiment will be described.

The solid-state imaging device 1A according to the first embodiment includes the transfer transistor TR having the gate electrode 31 provided in the isolation region 21. Then, in the gate electrode 31, the trunk 31*b* embedded in the isolation insulating film 27 of the isolation region 21 has the first portion $\mathbf{31}b_1$ adjacent to the semiconductor layer 20 in the active region 22A with the gate insulating film 29*a* interposed therebetween and the second portion $\mathbf{31}b_2$ adjacent to the isolation insulating film 27. With such a configuration, the capacitance component (parasitic capacitance) added to the gate electrode 31 can be reduced as compared with the conventional case where the periphery of the trunk 31*b* of the gate electrode 31, that is, all the side walls in the four directions of the trunk 31*b* are adjacent to the semiconductor layer 20 with the gate insulating film 29*a* interposed therebetween. Then, a capacitance of a transfer line connected to the gate electrode 31 of the transfer transistor TR decreases, and thus, rounding of a drive pulse applied to the gate electrode 31 of the transfer transistor TR can be improved. Therefore, with the solid-state imaging device 1A according to the first embodiment, it is possible to improve a transfer speed (pixel driving speed) at which the signal charge photoelectrically converted by the photoelectric conversion unit is transferred to the charge accumulation region.

In the method for manufacturing the solid-state imaging device 1A according to the first embodiment, the semiconductor layer 20 located immediately below the isolation region 21 functions as the etching stopper when the isolation insulating film 27 is etched to form the gate trench 28, and thus, it is possible to suppress the variation in the depth direction (Z direction) of the gate trench 28 as compared with the case where the gate trench is formed in the active region of the semiconductor layer as in the related art.

Furthermore, since the variation in the depth direction (Z direction) of the gate trench 28 can be suppressed, the variation in the depth direction of the trunk 31*b* of the gate electrode 31, that is, the variation in the gate length (channel length) of the trunk 31*b* of the gate electrode 31 can also be suppressed depending on the suppression of the variation in the depth direction of the gate trench 28. Therefore, it is possible to suppress the variation in the transfer characteristics of the transfer transistor TR with the method for manufacturing the solid-state imaging device 1A according to the first embodiment.

Here, it is desirable to reduce a size of the trunk 31*b* of the gate electrode 31 of the transfer transistor TR if a pixel size decreases. However, the trunk 31*b* of the gate electrode 31 is required to have a certain depth in the depth direction since the photoelectric conversion unit 25 is arranged to be separated from the charge accumulation region FD in the depth direction, and thus, an aspect ratio of the gate trench 28 in which the trunk 31*b* is embedded increases. For example, if the depth of the trunk is about 400 nm to 1000 nm and an opening of the gate trench is about 200 nm, the aspect ratio is about 2 to 5.

In regard to this, the isolation trench 26 of the isolation region 21 is less likely to be laid out in an isolated pattern like the gate trench 28 and is often formed with a relatively low aspect ratio, and thus, an opening variation can be reduced as compared with a single pattern of the gate trench 28.

Furthermore, the isolation insulating film 27 of the isolation region 21 is etched to form the gate trench 28, the gate material is embedded in the gate trench 28 to form the trunk 31*b* of the gate electrode 31, and thus, the semiconductor layer 20 can be used as the etching stopper. Then, the depth of the trunk 31*b* is hardly affected by the opening variation of the gate trench 28 and can be controlled by a depth of the isolation trench 26 of the isolation region 21, and thus, a depth variation of the trunk can be reduced as compared with the isolated pattern. Since the depth of the trunk is greatly affected particularly by the transfer characteristics, it is possible to improve a pixel characteristic (saturation charge amount) by reducing a processing variation of the trunk 31*b*.

Note that transistors, such as the transfer transistor TR, the reset transistor RST, the amplification transistor AMP, and the selection transistor SEL, may have a lightly doped drain (LDD) structure. The transistor having the LDD structure includes a gate insulating film, a gate electrode, a pair of extension regions formed in a self-aligned manner with respect to the gate electrode, a side wall spacer formed on a side wall of the gate electrode, and a pair of contact regions formed in a self-aligned manner with respect to the side wall spacer and having a higher impurity concentration than the external region.

MODIFIED EXAMPLES

In the first embodiment described above, the case where the first portion $\mathbf{31}b_1$ of the gate electrode 31 is provided on one end side in the longitudinal direction of the active region 22A has been described. However, the present technology is not limited to the configuration of the first embodiment described above.

Figure 7A:
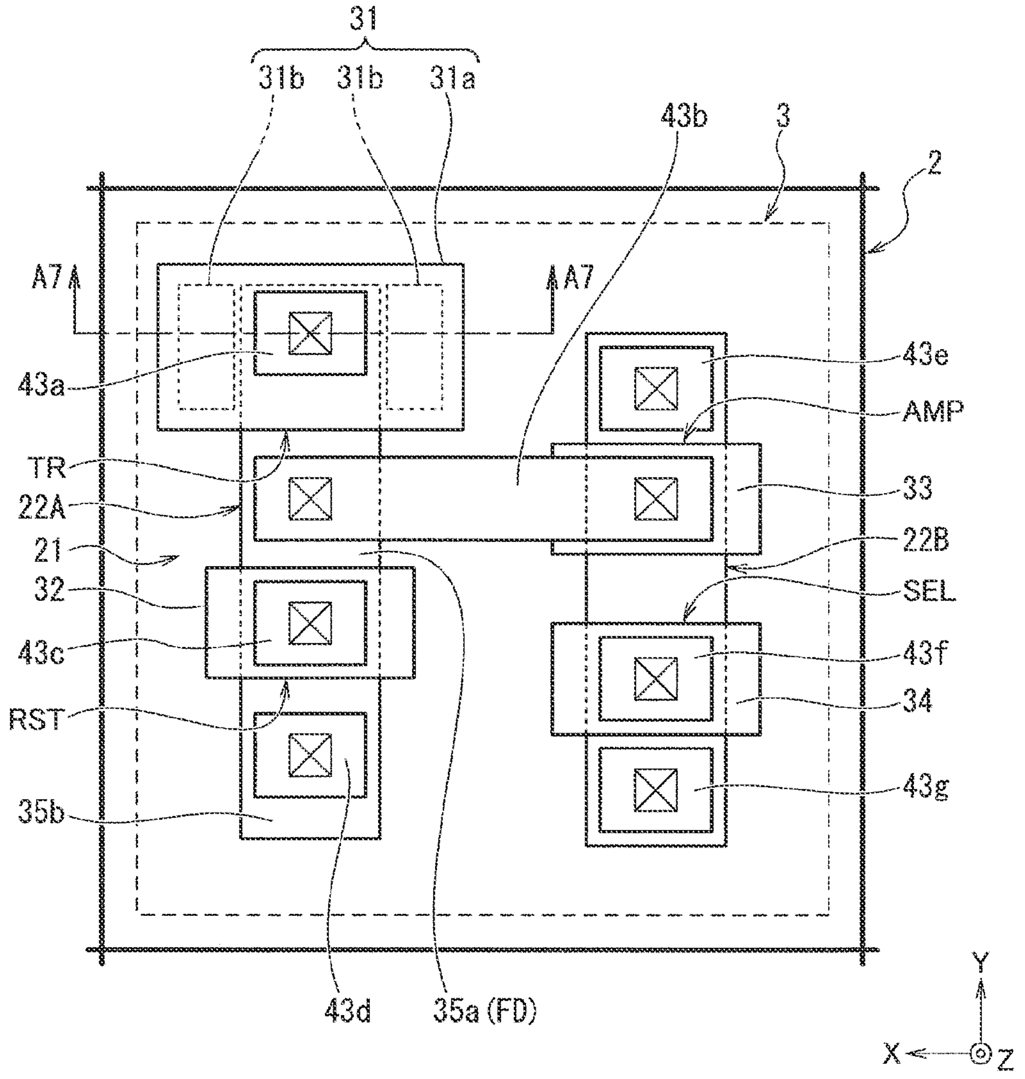
FIG. 7A is a plan view schematically illustrating a first modified example of the first embodiment.
Figure 7B:
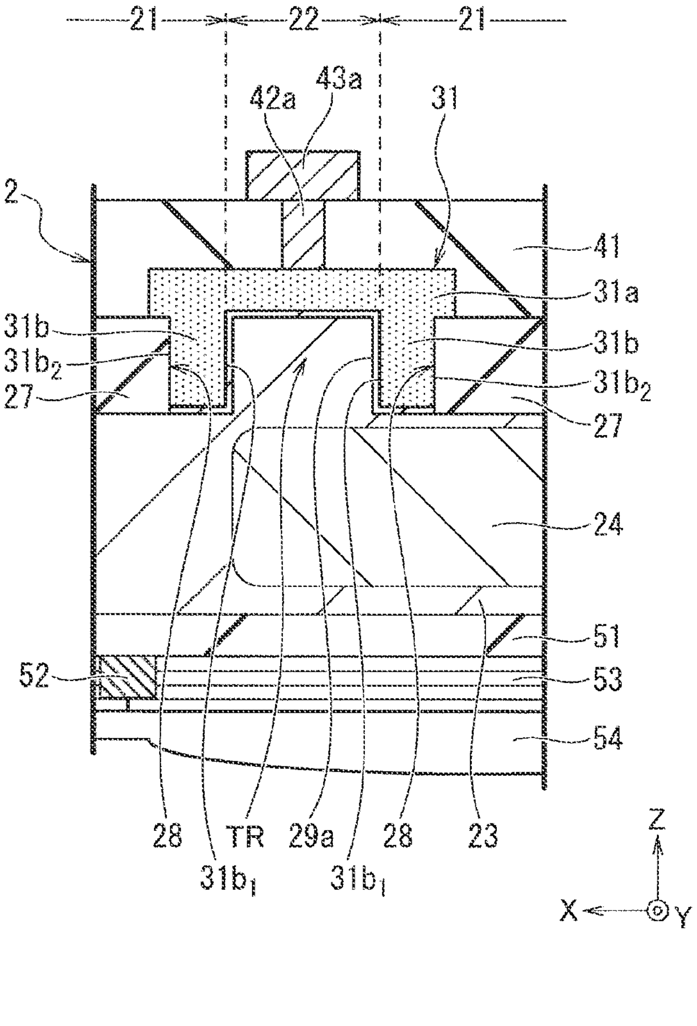
FIG. 7B is a cross-sectional view schematically illustrating a cross-sectional structure taken along a line A7-A7 in FIG. 7A.

For example, as a first modified example, a configuration may be adopted in which two trunks 31*b* are provided so as to sandwich the active region 22 in a plan view in a width direction (the X direction) of the active region 22, and each of the two trunks 31*b* has the first portion $\mathbf{31}b_1$ adjacent to the semiconductor layer 20 of the active region 22 with the gate insulating film 29*a* interposed therebetween and the second portion $\mathbf{31}b_2$ adjacent to the isolation insulating film 27 of the isolation region 21 as illustrated in FIGS. 7A and 7B. In this case, the first portion $\mathbf{31}b_1$ and the second portion $\mathbf{31}b_2$ of the gate electrode 31 are provided in each of regions located on mutually opposite sides across the active region 22 in the plan view.

In the first modified example as well, it is possible to improve a transfer speed (pixel driving speed) at which a signal charge photoelectrically converted by the photoelectric conversion unit 25 is transferred to the charge accumulation region FD similarly to the first embodiment described above.

Figure 8:
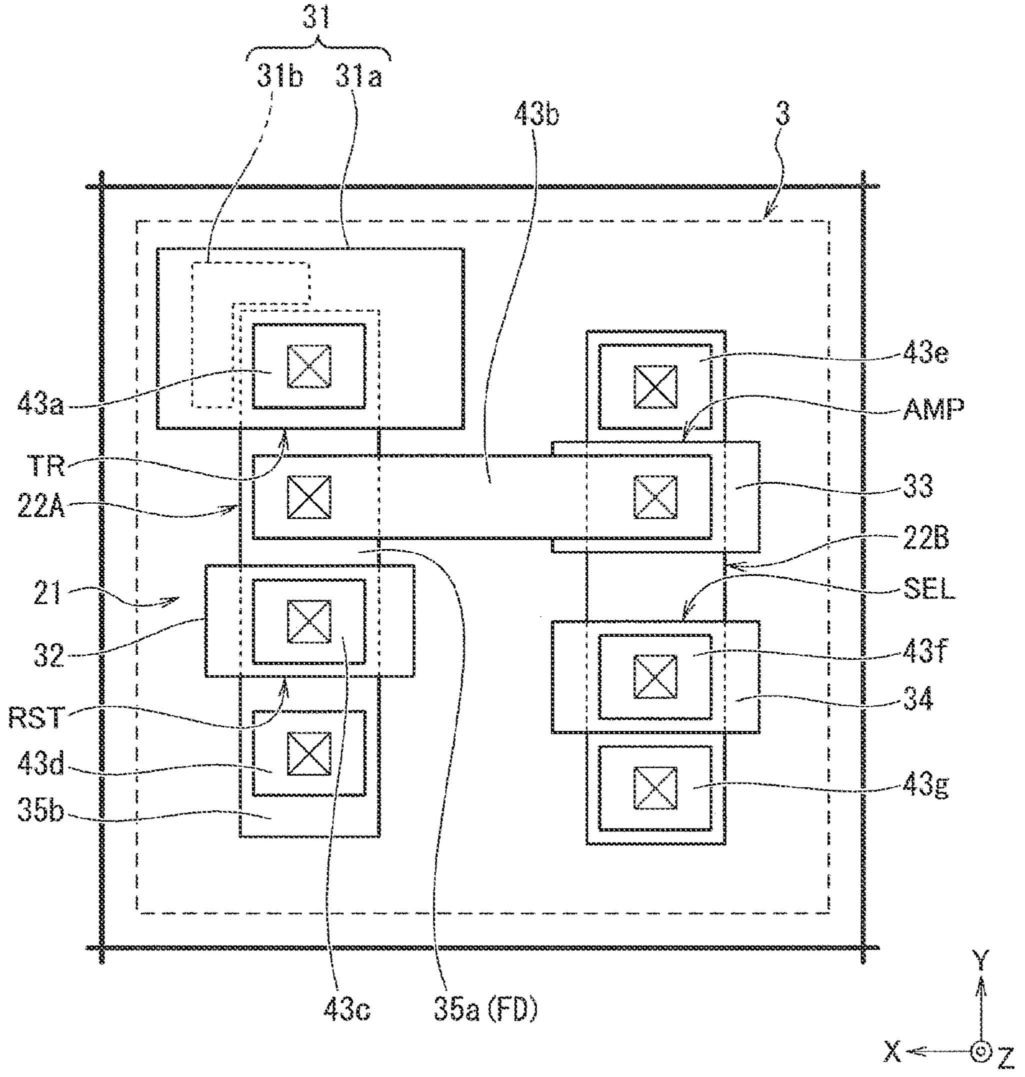
FIG. 8 is a plan view schematically illustrating a second modified example of the first embodiment.

Furthermore, as a second modified example, a configuration may be adopted in which the trunk 31*b* is configured in an L shape so as to surround one corner of one end in a longitudinal direction (the Y direction) of the active region 22A in a plan view, and the trunk 31*b* has the first portion $\mathbf{31}b_1$ adjacent to the semiconductor layer 20 of the active region 22 with the gate insulating film 29*a* interposed therebetween and the second portion $31b_2$ adjacent to the isolation insulating film 27 of the isolation region 21 as illustrated in FIG. 8. In this case, the first portion $31b_1$ and the second portion $31b_2$ of the gate electrode 31 are provided so as to surround the one corner on the one end side in the longitudinal direction of the active region 22 in the plan view.

In the second modified example as well, it is possible to improve a transfer speed (pixel driving speed) at which a signal charge photoelectrically converted by the photoelectric conversion unit 25 is transferred to the charge accumulation region FD similarly to the first embodiment described above.

Figure 9:
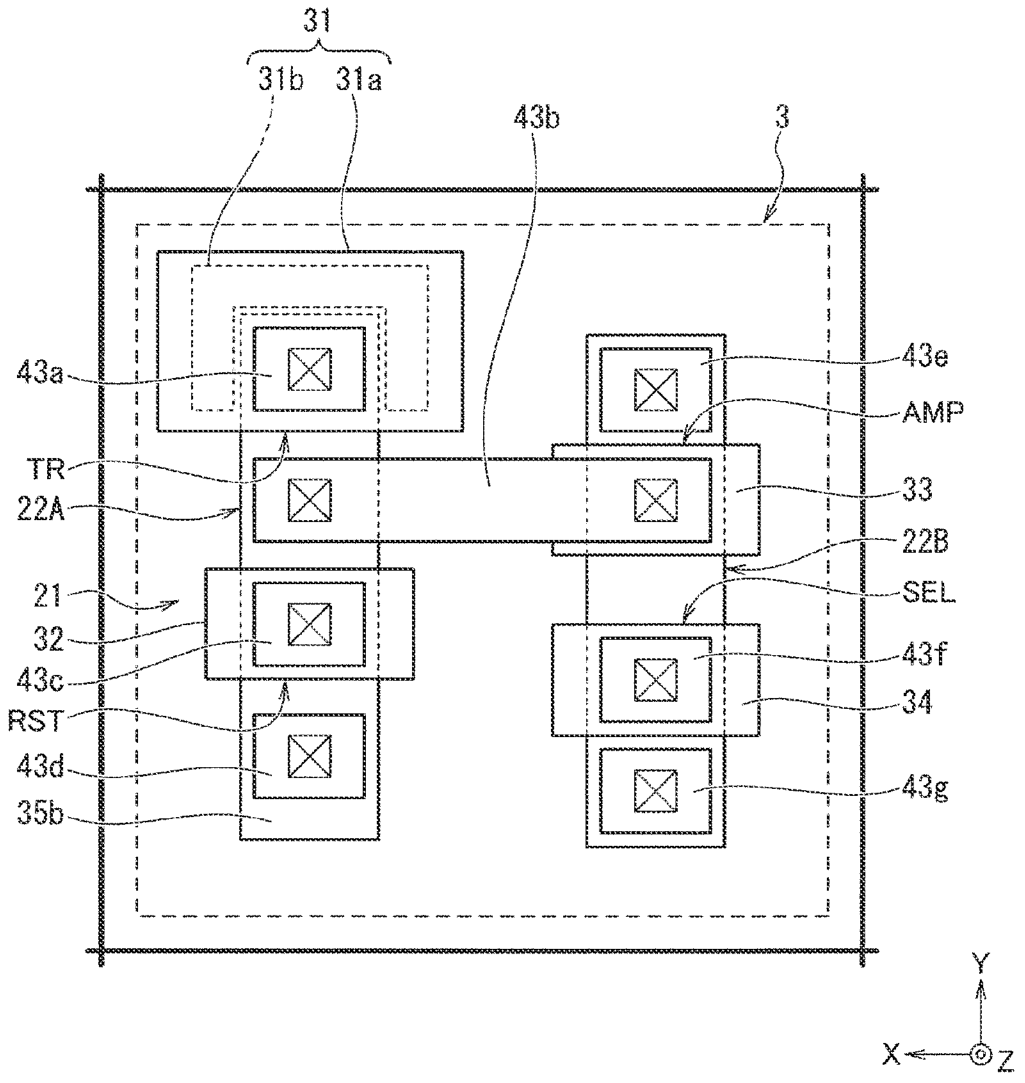
FIG. 9 is a plan view schematically illustrating a third modified example of the first embodiment.

Furthermore, as a third modified example, a configuration may be adopted in which the trunk 31*b* is configured in a U shape so as to surround two corners on one end side in a longitudinal direction of the active region 22 in a plan view, and the trunk 31*b* has the first portion $31b_1$ adjacent to the semiconductor layer 20 of the active region 22 with the gate insulating film 29*a* interposed therebetween and the second portion $31b_2$ adjacent to the isolation insulating film 27 of the isolation region 21 as illustrated in FIG. 9. In this case, the first portion $31b_1$ and the second portion $31b_2$ of the gate electrode 31 are provided so as to surround the two corners on the one end side in the longitudinal direction of the active region 22 in the plan view.

In the third modified example as well, it is possible to improve a transfer speed (pixel driving speed) at which a signal charge photoelectrically converted by the photoelectric conversion unit 25 is transferred to the charge accumulation region FD similarly to the first embodiment described above.

Second Embodiment

Figure 10A:
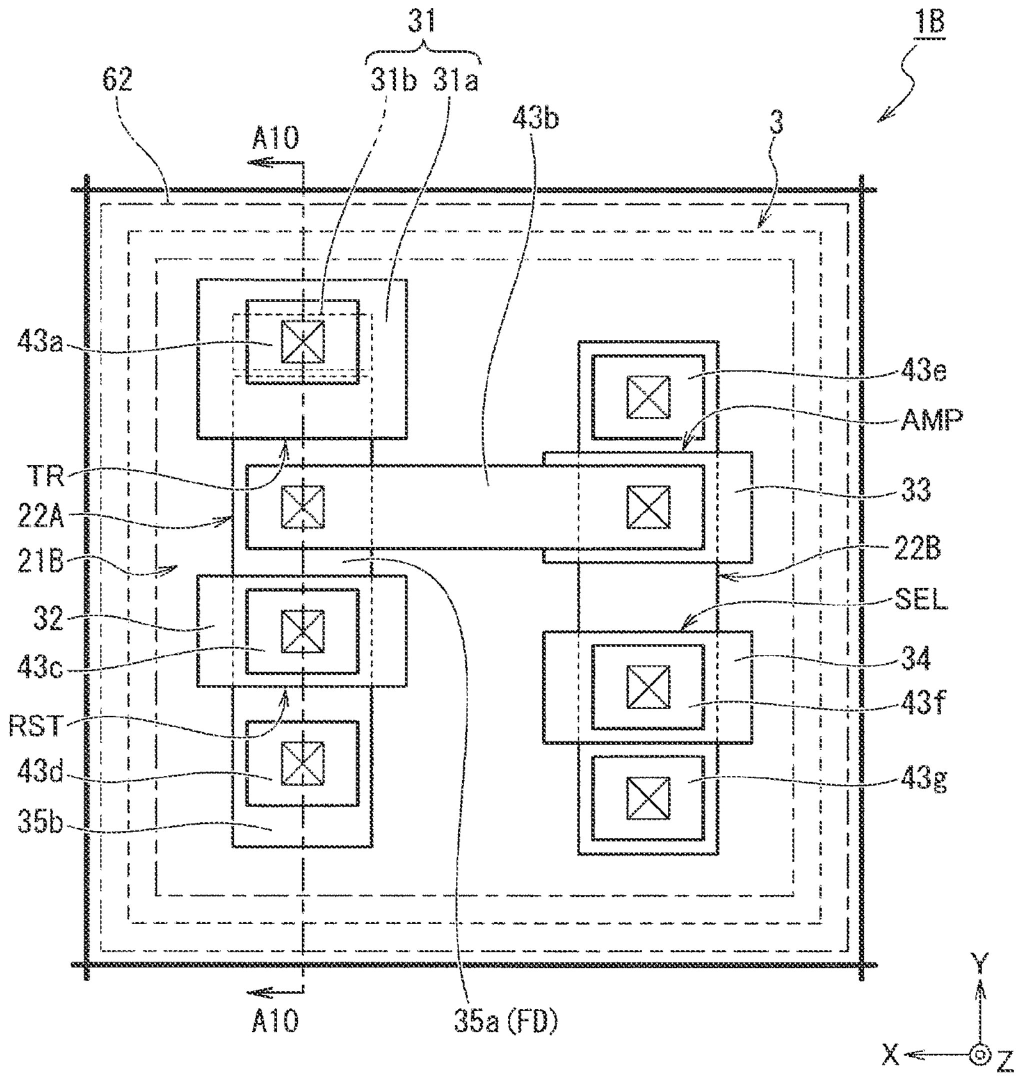
FIG. 10A is a plan view schematically illustrating a configuration example of a solid-state imaging device according to a second embodiment of the present technology.
Figure 10B:
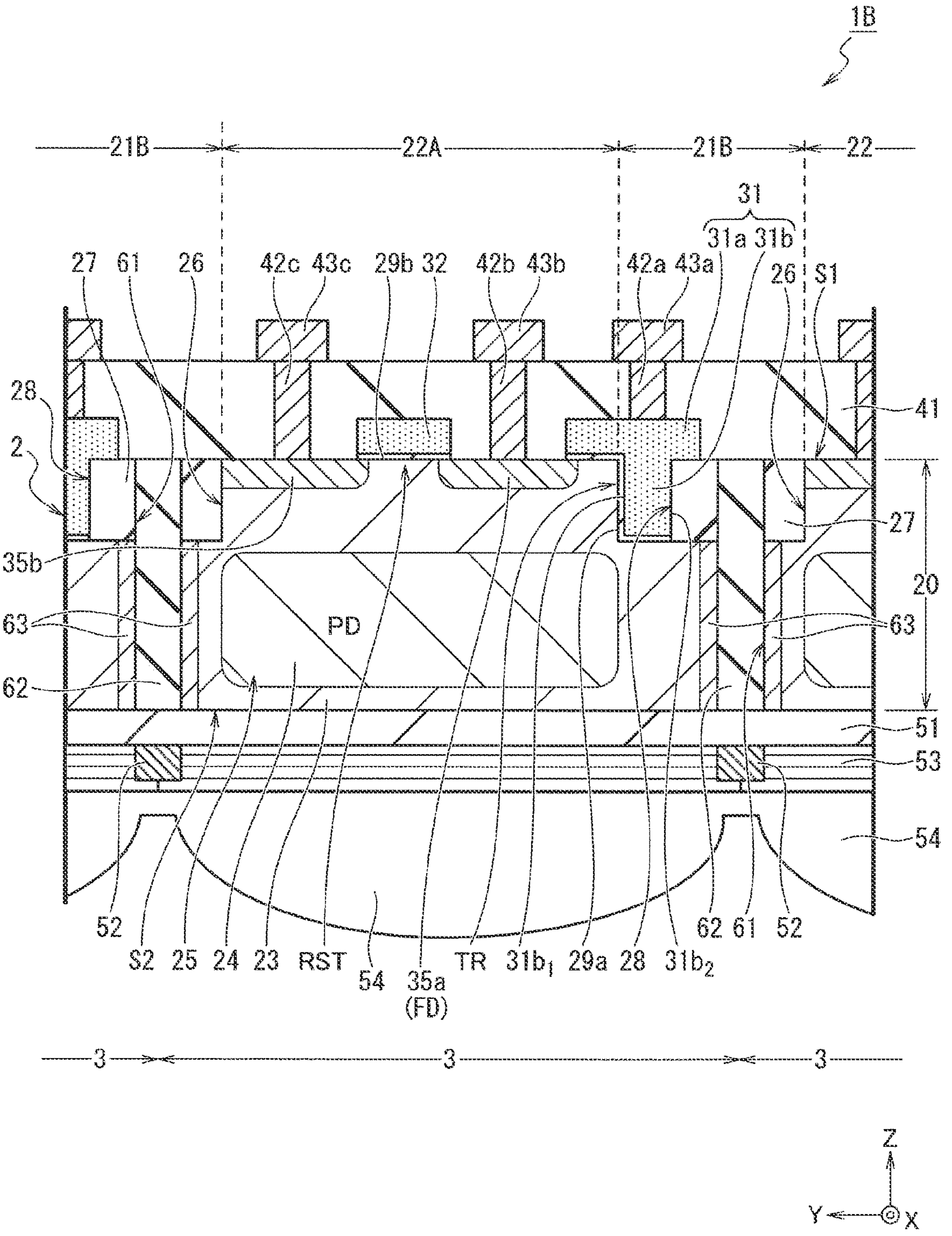
FIG. 10B is a plan view schematically illustrating a cross-sectional structure taken along a line A10-A10 in FIG. 10 A.

As illustrated in FIGS. 10A and 10B, a solid-state imaging device 1B according to a second embodiment of the present technology basically has a configuration similar to that of the solid-state imaging device 1A according to the first embodiment described above, and is different in the following configuration.

That is, as illustrated in FIGS. 10A and 10B, the solid-state imaging device 1B according to the second embodiment includes an isolation region 21B instead of the isolation region 21 illustrated in FIG. 5A of the first embodiment described above. The other configurations are substantially similar to those of the first embodiment described above.

As illustrated in FIGS. 10A and 10B, the isolation region 21B includes the isolation trench 26 provided on the first surface S1 side of the semiconductor layer 20 and the isolation insulating film 27 provided in the isolation trench 26. Furthermore, the isolation region 21B includes: an isolation trench 61 penetrating from an upper surface side of the isolation insulating film 27 to the second surface S2 side of the semiconductor layer 20; an isolation insulating film 62 embedded in the isolation trench 61; and p-type semiconductor regions 63 provided along the isolation insulating film 62 on both sides of the isolation insulating film 62 in a plan view. That is, the isolation region 21B penetrates from the first surface S1 side to the second surface S2 side of the semiconductor layer 20. The isolation insulating film 62 and the p-type semiconductor regions 63 form a square annular planar pattern surrounding the periphery of the photoelectric conversion unit 25 in the plan view in one pixel 3. The p-type semiconductor region 63 is configured to have a higher impurity concentration than the p-type semiconductor region 23, and pins side walls of the isolation trench 61.

In the second embodiment, the trunk 31*b* of the gate electrode 31 is separated from the p-type semiconductor region 63 having a high impurity concentration, and thus, a position of the trunk 31*b* of the gate electrode 31 can be controlled in the isolation region 21B.

In the solid-state imaging device 1B according to the second embodiment as well, effects similar to those of the solid-state imaging device 1A according to the first embodiment described above can be obtained.

Third Embodiment

Figure 11A:
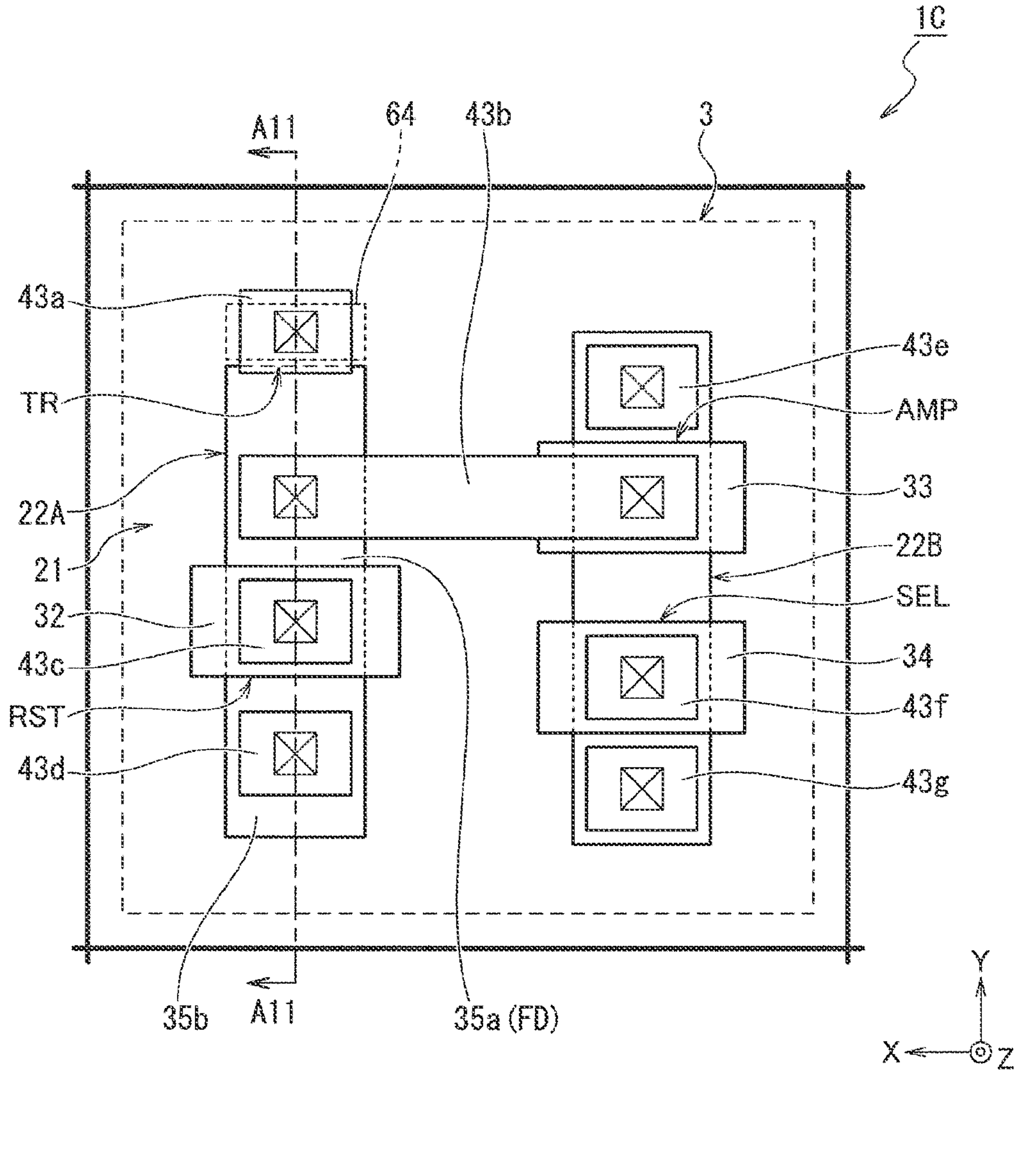
FIG. 11A is a plan view schematically illustrating a configuration example of a solid-state imaging device according to a third embodiment of the present technology.
Figure 11B:
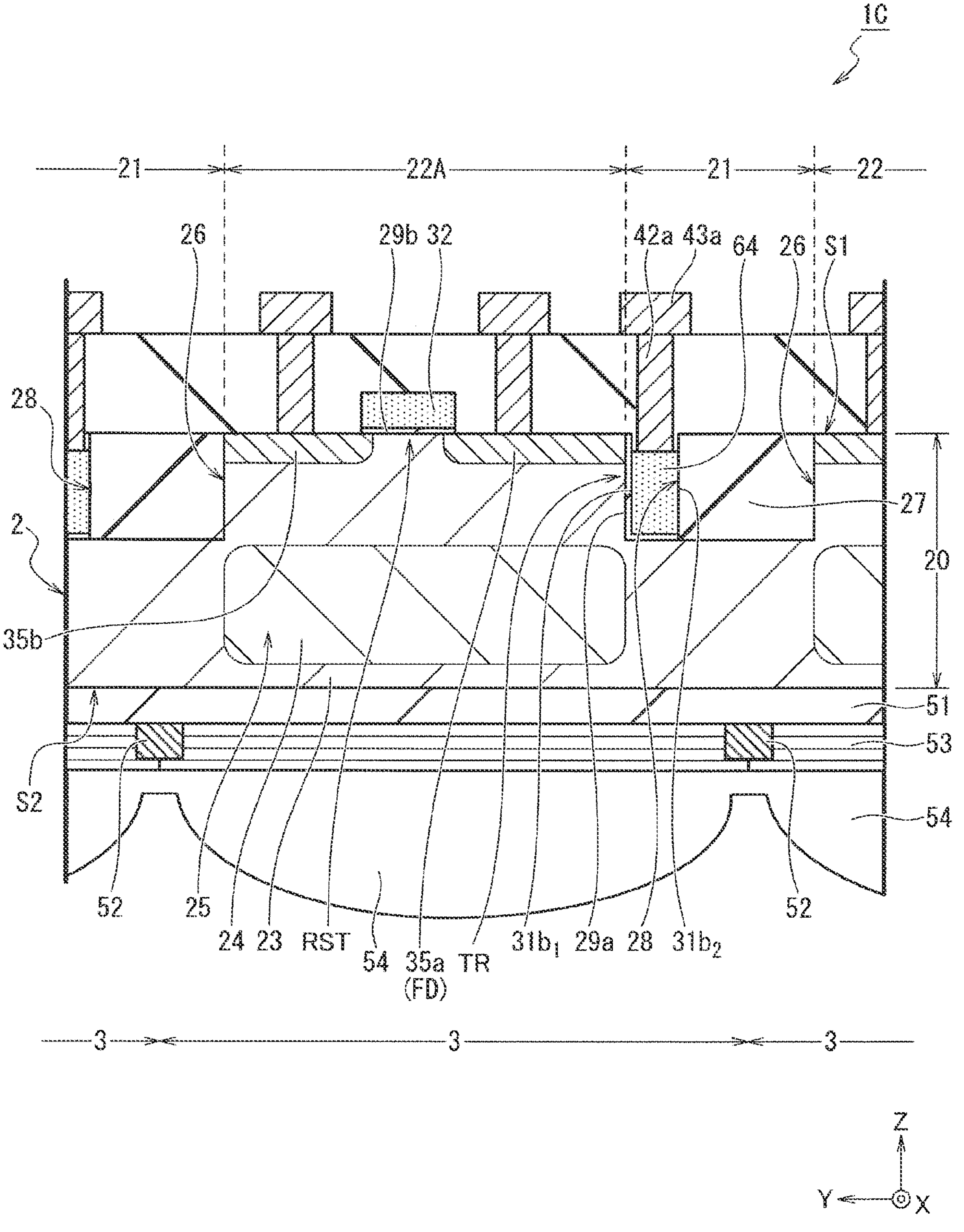
FIG. 11B is a plan view schematically illustrating a cross-sectional structure taken along a line A11-A11 in FIG. 11 A.

As illustrated in FIGS. 11A and 11B, a solid-state imaging device 1C according to a third embodiment of the present technology basically has a configuration similar to that of the solid-state imaging device 1A according to the first embodiment described above, and is different in the following configuration.

That is, as illustrated in FIGS. 11A and 11B, the solid-state imaging device 1C according to the third embodiment includes a gate electrode 64 instead of the gate electrode 31 illustrated in FIG. 5A of the first embodiment described above. The other configurations are substantially similar to those of the first embodiment described above.

As illustrated in FIGS. 11A and 11B, the gate electrode 64 is provided on one end side in a longitudinal direction of the active region 22A in a plan view. Then, the entire gate electrode 64 is buried in an isolation insulating film. Then, the gate electrode 64 includes the first portion $31b_1$ adjacent to (facing) the semiconductor layer 20 in the active region 22A with the gate insulating film 29*a* interposed therebetween, and the second portion $31b_2$ adjacent to (facing) the isolation insulating film 27, which is similar to the trunk 31*b* of the first embodiment described above. The gate electrode 64 is formed in, for example, a rectangular parallelepiped.

Since a structure in which the entire gate electrode 64 is buried in the isolation insulating film is adopted in this manner, the charge accumulation region FD can be provided in an upper part along the gate electrode 64, so that an overhanging part of an electrode can be eliminated, the degree of freedom of a layout is improved, and miniaturization can be achieved.

In the solid-state imaging device 1C according to the third embodiment as well, effects similar to those of the solid-state imaging device 1A according to the first embodiment described above can be obtained.

Fourth Embodiment: Electronic Apparatus

Next, an electronic apparatus according to a fourth embodiment of the present technology will be described with reference to FIG. 12.

As illustrated in FIG. 12, an electronic apparatus 100 according to the fourth embodiment includes the solid-state imaging device 101, the optical lens 102, a shutter device 103, a drive circuit 104, and a signal processing circuit 105. The electronic apparatus 100 of the fourth embodiment illustrates an embodiment in a case where the solid-state imaging device 1A according to the first embodiment of the present technology is used in an electronic apparatus (for example, a camera) as the solid-state imaging device 101.

The optical lens 102 forms an image of image light (the incident light 106) from a subject on an imaging surface of the solid-state imaging device 101. Therefore, a signal charge is accumulated in the solid-state imaging device 101 over a certain period. The shutter device 103 controls a light irradiation period and a light shielding period with respect to the solid-state imaging device 101. The drive circuit 104 supplies a drive signal for controlling a transfer operation of the solid-state imaging device 101 and a shutter operation of the shutter device 103. Signal transfer of the solid-state imaging device 101 is performed by the drive signal (timing signal) supplied from the drive circuit 104. The signal processing circuit 105 performs various types of signal processing on a signal (pixel signal) output from the solid-state imaging device 101. A video signal subjected to the signal processing is stored in a storage medium such as a memory or output to a monitor.

Note that the electronic apparatus 100 to which the solid-state imaging device 1A can be applied is not limited to the camera, and can also be applied to other electronic apparatuses. For example, the present invention may be applied to an imaging device such as a camera module for a mobile apparatus such as a mobile phone or a tablet terminal.

Furthermore, the configuration in which the solid-state imaging device 1A according to the first embodiment described above is used in the electronic apparatus as the solid-state imaging device 101 is adopted in the fourth embodiment, but another configuration may be adopted. For example, the solid-state imaging device 1B according to the second embodiment, the solid-state imaging device 1C according to the third embodiment, and the solid-state imaging devices according to the modified examples may be used in an electronic apparatus.

Note that the present technology may have the following configuration.

(1)

A solid-state imaging device including:

a semiconductor layer which has a first surface and a second surface located on mutually opposite sides, and has an active region defined by an isolation region on the first surface side;

a charge accumulation region provided in the active region;

a photoelectric conversion unit provided in the semiconductor layer to be separated from the charge accumulation region in a depth direction; and a transfer transistor that has a gate electrode provided in the isolation region and transfers a signal charge photoelectrically converted by the photoelectric conversion unit to the charge accumulation region, in which the isolation region includes an isolation insulating film provided on the first surface side of the semiconductor layer, and the gate electrode includes a first portion adjacent to the active region with a gate insulating film interposed between the first portion and the active region, and a second portion adjacent to the isolation insulating film.

(2)

The solid-state imaging device according to (1) described above, in which the first portion of the gate electrode is provided on one end side of the active region in a plan view.

(3)

The solid-state imaging device according to (1) described above, in which the first portion of the gate electrode is provided in each of regions located on mutually opposite sides across the active region in a plan view.

(4)

The solid-state imaging device according to (1) described above, in which the first portion of the gate electrode is provided to surround a corner on one end side of the active region in a plan view.

(5)

The solid-state imaging device according to (1) described above, in which the first portion of the gate electrode is provided to surround two corners on one end side of the active region in a plan view.

(6)

The solid-state imaging device according to any one of (1) to (5) described above, in which the isolation region extends over the first surface and the second surface of the semiconductor layer.

(7)

The solid-state imaging device according to any one of (1) to (6) described above, in which the gate electrode is embedded in the isolation insulating film.

(8)

The solid-state imaging device according to any one of (1) to (6) described above, in which the gate electrode includes a head which is provided on the first surface side of the semiconductor layer, and a trunk which protrudes from the head into the isolation insulating film to be narrower than the head.

(9)

The solid-state imaging device according to any one of (1) to (8) described above, in which the gate insulating film is a thermal oxide film, and the isolation insulating film is a deposited film.

(10)

A method for manufacturing a solid-state imaging device, the method including:

forming an isolation trench that defines an active region on a first surface side of a semiconductor layer;

forming an isolation insulating film in the isolation trench;

etching the isolation insulating film in a depth direction of the isolation trench to form a gate trench surrounded by the semiconductor layer and the isolation insulating film in the isolation insulating film;

forming a gate insulating film on the semiconductor layer in the gate trench; and forming a gate electrode in a front gate trench with the gate insulating film interposed between the gate electrode and the front gate trench.

(11)

An electronic apparatus including: a solid-state imaging device; an optical lens that forms an image of image light from a subject on an imaging surface of the solid-state imaging device; and a signal processing circuit that performs signal processing on a signal output from the solid-state imaging device, in which the solid-state imaging device includes:

a semiconductor layer which has a first surface and a second surface located on mutually opposite sides, and has an active region defined by an isolation region on the first surface side;

a charge accumulation region provided in the active region of the semiconductor layer;

a photoelectric conversion unit provided in the semiconductor layer to be separated from the charge accumulation region in a depth direction; and a transfer transistor that has a gate electrode provided in the isolation region and transfers a signal charge photoelectrically converted by the photoelectric conversion unit to the charge accumulation region, the isolation region includes an isolation insulating film provided in a trench on the first surface side of the semiconductor layer, and the gate electrode includes a first portion adjacent to the active region with a gate insulating film interposed between the first portion and the active region, and a second portion adjacent to the isolation insulating film.

The scope of the present technology is not limited to the illustrated and described exemplary embodiments, but also includes all embodiments that provide equivalent effects to those for which the present technology is intended. Moreover, the scope of the present technology is not limited to combinations of features of the invention drawn by the claims, but may be drawn by various desired combinations of specific features among all the disclosed respective features.

REFERENCE SIGNS LIST

1 Solid-state imaging device
2 Semiconductor chip
2A Pixel region
2B Peripheral region
3 Pixel
4 Vertical drive circuit
5 Column signal processing circuit
6 Horizontal drive circuit
7 Output circuit
8 Control circuit
10 Pixel drive line
12 Horizontal signal line
13 Logic circuit
14 Bonding pad
15 Read circuit
20 Semiconductor layer
21 Isolation region
22A, 22B Active region
23 p-type semiconductor region
24 n-type semiconductor region
25 Photoelectric conversion unit
26 Isolation trench
27 Isolation insulating film
28 Gate trench
29 Gate insulating film
30 Gate material
31 Gate electrode
31*a* Head
31*b* Trunk
31$b_1$ First portion
31$b_2$ Second portion
32, 33, 34 Gate electrode
35*a*, 35*b* Main electrode region
41 Interlayer insulating film
42*a*, 42*b*, 42*c* Contact electrode
43 Wiring layer
43*a*, 43*b*, 43*c*, 43*d*, 43*e*, 43*f* Wiring
51 Planarization film
52 Light shielding film
53 Color filter
54 Microlens
61 Isolation trench
62 Isolation insulating film
63 p-type semiconductor region
64 Gate electrode
AMP Amplification transistor
FD Charge accumulation region
RST Reset transistor
SEL Selection transistor
TR Transfer transistor

What is claimed is:

1. A solid-state imaging device, comprising:

a semiconductor layer which has a first surface and a second surface located on mutually opposite sides, and has an active region defined by an isolation region on the side of the first surface;

a charge accumulation region provided in the active region;

a photoelectric conversion unit provided in the semiconductor layer to be separated from the charge accumulation region in a depth direction; and a transfer transistor that has a gate electrode provided in the isolation region and transfers a signal charge photoelectrically converted by the photoelectric conversion unit to the charge accumulation region, wherein the isolation region includes an isolation insulating film provided on the side of the first surface of the semiconductor layer, and wherein the gate electrode includes a first portion adjacent to the active region with a gate insulating film interposed between a side wall of the first portion and the active region and between a bottom wall of the first portion and the semiconductor layer, and a second portion adjacent to and in contact with the isolation insulating film.

2. The solid-state imaging device according to claim 1, wherein the first portion of the gate electrode is provided on one end side of the active region in a plan view.

3. The solid-state imaging device according to claim 1, wherein the first portion of the gate electrode is provided in each of regions located on mutually opposite sides across the active region in a plan view.

4. The solid-state imaging device according to claim 1, wherein the first portion of the gate electrode is provided to surround a corner on one end side of the active region in a plan view.

5. The solid-state imaging device according to claim 1, wherein the first portion of the gate electrode is provided to surround two corners on one end side of the active region in a plan view.

6. The solid-state imaging device according to claim 1, wherein the isolation region extends over the first surface and the second surface of the semiconductor layer.

7. The solid-state imaging device according to claim 1, wherein the gate electrode is embedded in the isolation insulating film.

8. The solid-state imaging device according to claim 1, wherein the gate electrode includes a head which is provided on the side of the first surface of the semiconductor layer, and a trunk which protrudes from the head into the isolation insulating film to be narrower than the head.

9. The solid-state imaging device according to claim 1, wherein the gate insulating film is a thermal oxide film, and the isolation insulating film is a deposited film.

10. An electronic apparatus comprising:

a solid-state imaging device; an optical lens that forms an image of image light from a subject on an imaging surface of the solid-state imaging device; and a signal processing circuit that performs signal processing on a signal output from the solid-state imaging device, wherein the solid-state imaging device includes:

a semiconductor layer which has a first surface and a second surface located on mutually opposite sides, and has an active region defined by an isolation region on the side of the first surface;

a charge accumulation region provided in the active region of the semiconductor layer;

a photoelectric conversion unit provided in the semiconductor layer to be separated from the charge accumulation region in a depth direction; and a transfer transistor that has a gate electrode provided in the isolation region and transfers a signal charge photoelectrically converted by the photoelectric conversion unit to the charge accumulation region, the isolation region includes an isolation insulating film provided in a trench on the side of the first surface of the semiconductor layer, and wherein the gate electrode includes a first portion adjacent to the active region with a gate insulating film interposed between a side wall of the first portion and the active region and between a bottom wall of the first portion and the semiconductor layer, and a second portion adjacent to and in contact with the isolation insulating film.

* * * * *